(12) United States Patent
Lee

(10) Patent No.: US 12,284,887 B2
(45) Date of Patent: Apr. 22, 2025

(54) DISPLAY DEVICE COMPRISING PIXEL INDUCTORS

(71) Applicant: Samsung Display Co., LTD., Yongin-si (KR)

(72) Inventor: Gwang Teak Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 443 days.

(21) Appl. No.: 17/579,479

(22) Filed: Jan. 19, 2022

(65) Prior Publication Data

US 2022/0406870 A1 Dec. 22, 2022

(30) Foreign Application Priority Data

Jun. 17, 2021 (KR) ........................ 10-2021-0079008

(51) Int. Cl.
*H10K 59/131* (2023.01)
*H01L 25/16* (2023.01)
*H10K 59/121* (2023.01)
*H10K 59/122* (2023.01)
*H10K 59/38* (2023.01)
*H10K 59/80* (2023.01)
*H10K 59/84* (2023.01)
*H01L 25/075* (2006.01)
*H01L 27/12* (2006.01)
*H10K 59/123* (2023.01)

(52) U.S. Cl.
CPC ......... *H10K 59/131* (2023.02); *H01L 25/167* (2013.01); *H10K 59/1213* (2023.02); *H10K 59/122* (2023.02); *H10K 59/38* (2023.02); *H01L 25/0753* (2013.01); *H01L 27/124* (2013.01); *H10K 59/123* (2023.02); *H10K 59/84* (2023.02); *H10K 59/875* (2023.02)

(58) Field of Classification Search
CPC . H01L 25/0753; H01L 25/167; H01L 27/124; H10K 59/1213; H10K 59/122; H10K 59/123; H10K 59/131; H10K 59/38; H10K 59/84; H10K 59/875
See application file for complete search history.

(56) References Cited

U.S. PATENT DOCUMENTS

| 6,567,285 | B2 | 5/2003 | Cho et al. |
| 6,826,059 | B2 | 11/2004 | Böckle et al. |
| 9,748,855 | B2 | 8/2017 | Lee |
| 9,794,993 | B2 | 10/2017 | Lee |

(Continued)

FOREIGN PATENT DOCUMENTS

| JP | 3682773 B2 | 6/2005 |
| KR | 10-2016-0130095 A | 11/2016 |

(Continued)

*Primary Examiner* — Herve-Louis Y Assouman
*Assistant Examiner* — Christopher M Roland
(74) *Attorney, Agent, or Firm* — Womble Bond Dickinson (US) LLP

(57) ABSTRACT

A display device includes a pixel including a primary inductor and a secondary inductor that are inductively coupled to each other, a pixel circuit electrically connected to the primary inductor, and configured to control a current flowing through the primary inductor by using at least one transistor, and a light emitting unit electrically connected to the secondary inductor, and including at least one light emitting element.

20 Claims, 16 Drawing Sheets

(56) References Cited

U.S. PATENT DOCUMENTS

| | | | |
|---|---|---|---|
| 11,488,520 B2 | 11/2022 | Lee et al. | |
| 2002/0054498 A1* | 5/2002 | Cho | H02M 3/3376 |
| | | | 363/132 |
| 2016/0323949 A1* | 11/2016 | Lee | H05B 45/385 |
| 2016/0344297 A1* | 11/2016 | Lee | H02M 3/33592 |

FOREIGN PATENT DOCUMENTS

| | | |
|---|---|---|
| KR | 10-2016-0135958 A | 11/2016 |
| KR | 10-2020-0040347 A | 4/2020 |

* cited by examiner

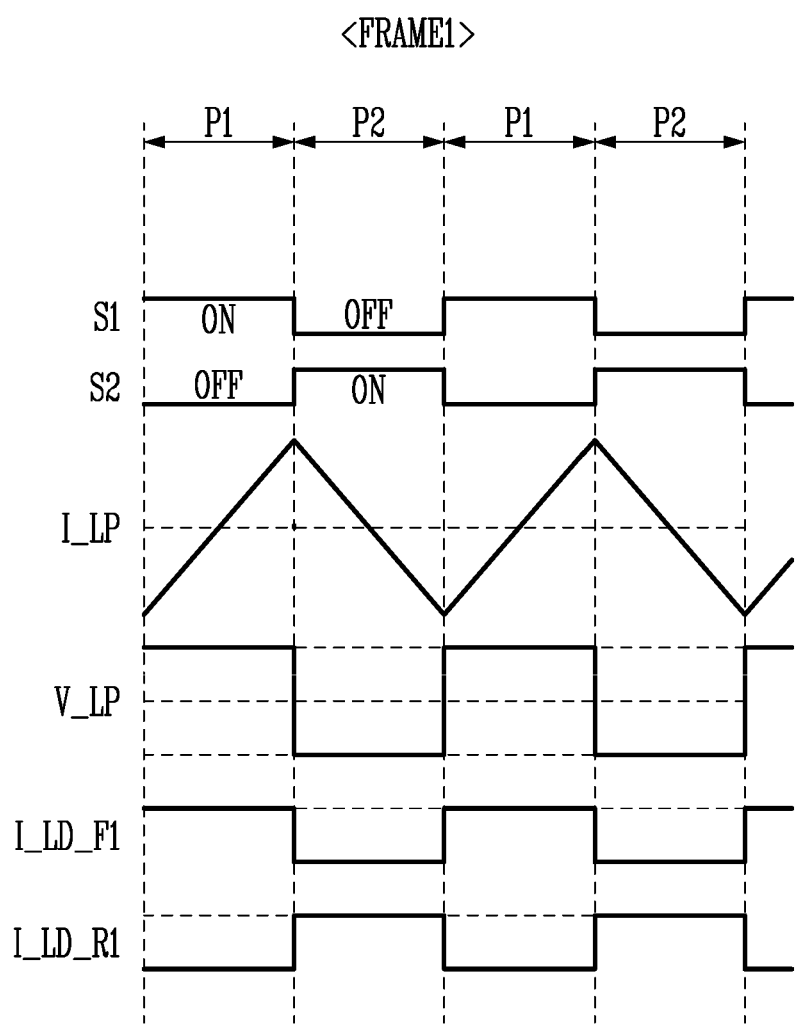

DISPLAY DEVICE COMPRISING PIXEL INDUCTORS

CROSS-REFERENCE TO RELATED APPLICATION

This application claims priority to, and the benefit of, Korean patent application No. 10-2021-0079008 filed in the Korean Intellectual Property Office on Jun. 17, 2021, the entire disclosure of which is incorporated herein by reference.

BACKGROUND

1. Field

The present disclosure generally relates to a display device.

2. Related Art

Recently, interest in information displays has increased. Accordingly, research and development of display devices are continuously conducted.

SUMMARY

Embodiments of the present disclosure provide a display device having improved luminance.

In accordance with an aspect of the present disclosure, there is provided a display device including a pixel including a primary inductor and a secondary inductor that are inductively coupled to each other, a pixel circuit electrically connected to the primary inductor, and configured to control a current flowing through the primary inductor by using at least one transistor, and a light emitting unit electrically connected to the secondary inductor, and including at least one light emitting element.

The primary inductor may be electrically connected between a first node and a second node, wherein the pixel circuit includes a first transistor electrically connected between a first power line and the first node, and a second transistor electrically connected between the first node and a second power line.

The first transistor may be turned on to provide a first current in a first current direction to the primary inductor in a first period, wherein the second transistor is turned on to provide a second current in a second current direction to the primary inductor in a second period.

A magnitude of current induced in the light emitting unit may decrease as a width of the first and second periods decreases.

The light emitting unit may include a first electrode, a second electrode, and first light emitting elements connected in parallel to each other between the first electrode and the second electrode, wherein the secondary inductor includes a first sub-inductor, wherein a first terminal of the first sub-inductor is electrically connected to the first electrode, and wherein a second terminal of the first sub-inductor is electrically connected to the second electrode.

The first light emitting elements may include a first forward light emitting element and a first reverse light emitting element, wherein the first forward light emitting element is connected in a first current direction between the first electrode and the second electrode, and wherein the first reverse light emitting element is connected in a second current direction that is different from the first current direction between the first electrode and the second electrode.

The second electrode may be electrically connected to the second power line.

The light emitting unit may further include a third electrode, a fourth electrode, and second light emitting elements connected in parallel to each other between the third electrode and the fourth electrode, wherein the fourth electrode is connected to the second electrode, wherein the secondary inductor further includes a second sub-inductor, wherein a first terminal of the second sub-inductor is connected to the second terminal of the first sub-inductor, and wherein a second terminal of the second sub-inductor is electrically connected to the third electrode.

A winding direction of the first sub-inductor may be different from that of the second sub-inductor.

The pixel may further include a protective layer over the first power line, the second power line, and the first transistor, and a first insulating layer on the protective layer, wherein the primary inductor is between the protective layer and the first insulating layer, wherein the first electrode, the second electrode, and the first sub-inductor are on the first insulating layer, and wherein, in a plan view, the first sub-inductor overlaps with the primary inductor.

In a plan view, the second sub-inductor may overlap with the primary inductor, but does not overlap with the first sub-inductor.

The pixel may further include a bank on the first insulating layer, the bank defining an emission area, wherein, in a plan view, the first sub-inductor and the first light emitting elements are in the emission area.

The pixel may further include a first pattern and a second pattern between the protective layer and the first insulating layer, a first alignment electrode between the first pattern and the first insulating layer, and a second alignment electrode between the second pattern and the first insulating layer, wherein the first electrode overlaps with the first alignment electrode, wherein the second electrode overlaps with the second alignment electrode, and wherein, in a plan view, the first light emitting elements are between the first electrode and the second electrode.

The first electrode might not be in contact with the first alignment electrode.

The first electrode may include a transparent conductive material, wherein the first alignment electrode includes a light reflective material.

The pixel may further include a light conversion pattern layer over the at least one light emitting element, wherein the light conversion pattern layer includes a color conversion layer for converting light of a first color, which is emitted from the at least one light emitting element, into light of a second color, and a color filter on the color conversion layer for allowing the light of the second color to be selectively transmitted therethrough.

The pixel may further include a bank on the first insulating layer and defining an emission area, wherein, in a plan view, the first light emitting elements are in the emission area, and wherein, in a plan view, the first sub-inductor overlaps with the bank.

In a plan view, the second sub-inductor may overlap with the first sub-inductor.

The primary inductor may be electrically connected between a first node and a second node, wherein the pixel circuit includes a first transistor electrically connected between a first power line and the first node, a second transistor electrically connected between a second power line and the first node, a third transistor electrically connected between the first power line and the second node, and a fourth transistor electrically connected between the second power line and the second node.

The first transistor and the fourth transistor may be configured to be turned on to provide a first current in a first current direction to the primary inductor in a first period, wherein the second transistor and the third transistor are configured to be turned on to provide a second current in a second current direction to the primary inductor in a second period.

BRIEF DESCRIPTION OF THE DRAWINGS

Embodiments of the present disclosure will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 6A and 6B are waveform diagrams illustrating an operation of the pixel shown in FIG. 3.

DETAILED DESCRIPTION

Figure 1:
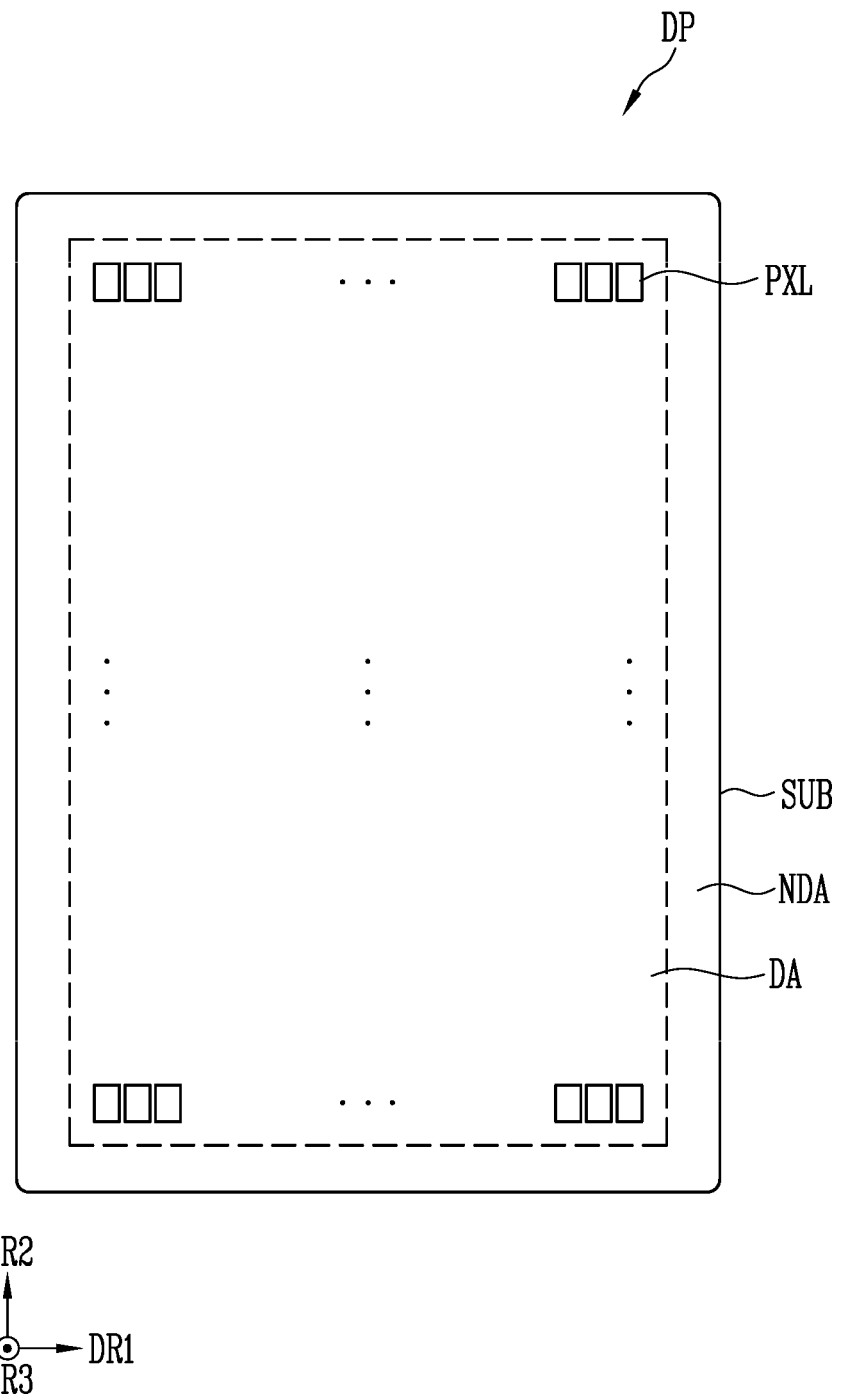
FIG. 1 is a plan view illustrating a display device in accordance with embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device in accordance with embodiments of the present disclosure. For convenience, in FIG. 1, a structure of a display panel DP will be briefly illustrated based on a display area DA. However, in some embodiments, at least one driving circuit, lines, and/or pads, which are not shown in the drawing, may be further provided in the display panel DP.

Referring to FIG. 1, the display device may include the display panel DP. The present disclosure may be applied as long as the display device is an electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, an automotive display (or vehicle display), a transparent display, or a wearable device (e.g., glasses or a smart watch).

The display panel DP may have various shapes. In some embodiments, the display panel DP may be provided in a rectangular plate shape, but the present disclosure is not limited thereto. For example, the display panel DP may have a shape such as a circular shape or an elliptical shape. Also, the display panel DP may include an angular corner and/or a curved corner. For convenience of description, a case where the display panel DP is provided in a rectangular shape having a pair of long sides and a pair of short sides is illustrated in FIG. 1. An extending direction of the long sides is designated as a second direction DR2, an extending direction of the short sides is designated as a first direction DR1, and a direction perpendicular to the extending directions of the long sides and the short sides is designated as a third direction DR3.

The display panel DP may display an image. A self-luminescent display panel, such as an inorganic light emitting display panel using an inorganic light emitting diode as a light emitting element, a micro-scale Light Emitting Diode (LED) display panel or nano-scale LED display panel using, as a light emitting element, an LED small to a degree of micrometer scale (or nanometer scale), or a Quantum Dot Organic Light Emitting Display panel (QD OLED panel) using a quantum dot and an inorganic light emitting diode, may be used as the display panel DP. In addition, a non-self-luminescent display panel, such as an Organic Light Emitting Display panel (OLED panel) using an organic light emitting diode as a light emitting element, a Liquid Crystal Display panel (LCD panel), an Electro-Phoretic Display panel (EPD panel), or an Electro-Wetting Display panel (EWD panel), may be used as the display panel DP.

The display panel DP and a substrate SUB for forming the same may include the display area DA for displaying an image and a non-display area NDA except the display area DA. The display area DA may constitute a screen on which the image is displayed, and the non-display area NDA may be the other area except the display area DA. In some embodiments, shapes of the display area DA and the non-display area NDA may be relatively designed.

Pixels PXL may be located in the display area DA on the substrate SUB. In some embodiments, the display area DA may include a plurality of pixel areas in which the respective pixels PXL are located.

The non-display area NDA may be located at the periphery of the display area DA. Various lines, pads, and/or a built-in circuit, which are connected to the pixels PXL of the display area DA, may be located in the non-display are NDA. In description of embodiments of the present disclosure, the term "connection (or coupling)" may inclusively mean physical and/or electrical connection (or coupling). Also, the term "connection (or coupling)" may inclusively mean direct or indirect connection (or coupling), and integral or non-integral connection (or coupling).

The display panel DP may include a substrate SUB (or base layer) and pixels PXL. The pixels PXL may be provided or located on the substrate SUB.

The substrate SUB may be made of an insulative material, such as glass or resin. Also, the substrate SUB may be made of a material having flexibility to be bendable or foldable, and may have a single-layer structure or a multi-layered structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like. However, the material constituting the substrate SUB is not limited to the above-described embodiments.

Each of the pixels PXL may be a minimum unit that displays an image. Each of the pixels PXL may include a light emitting element for emitting white light and/or colored light. Each of the pixels PXL may emit light of any one color among red, green, and blue. However, the present disclosure is not limited thereto, and each of the pixels PXL may emit light of a color such as cyan, magenta, or yellow. The light emitting element may be, for example, an inorganic light emitting diode including an inorganic light emitting material. However, the light emitting element is not limited thereto. For example, the light emitting element may be an organic light emitting diode.

The pixels PXL may be arranged in a matrix form along rows extending in the first direction DR1 and columns extending in the second direction DR2 intersecting the first direction DR1. However, the arrangement form of the pixels PXL is not particularly limited, and the pixels PXL may be arranged in various forms. In the drawings, it is illustrated that the pixels PXL have a rectangular shape. However, the present disclosure is not limited thereto, and the pixels PXL may be modified in various shapes. In addition, when a plurality of pixels PXL are provided, the plurality of pixels PXL may be provided to different areas (or sizes). For example, when pixels PXL having different colors of lights emitted therefrom are provided, the pixels PXL may be provided to have different areas (or sizes) or different shapes with respect to the colors.

Each pixel PXL may have a structure in accordance with one or more embodiments that will be described hereinafter. For example, the pixel PXL may have a structure to which any of the embodiments, which will be described later, is applied, or have a structure to which at least two embodiments are complexly applied.

Also, the pixel PXL may be configured as an active pixel, but the present disclosure is not limited thereto. For example, the pixel PXL may be configured as a pixel of a passive or active light emitting display device using various structures and/or driving methods.

Figure 2:
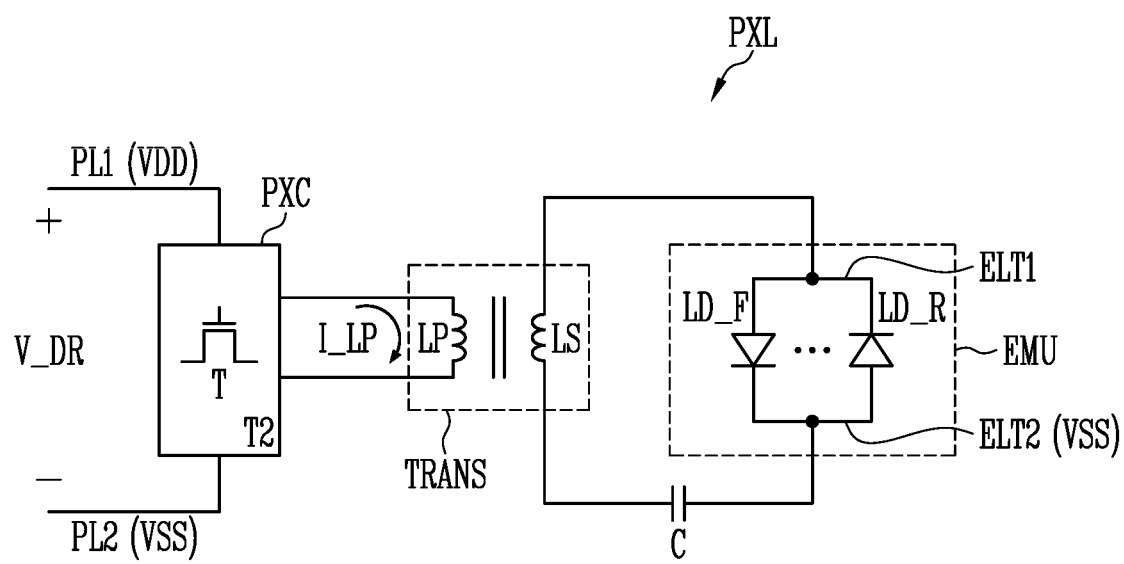
FIG. 2 is a circuit diagram illustrating a pixel included in the display device shown in FIG. 1.

FIG. 2 is a circuit diagram illustrating the pixel included in the display device shown in FIG. 1.

Referring to FIGS. 1 and 2, the pixel PXL may include a transformer TRANS, a pixel circuit PXC, and a light emitting unit EMU (or light emitting part).

The transformer TRANS may include a primary inductor LP and a secondary inductor LS, which are inductively coupled to each other.

The pixel circuit PXC may be connected between a first power line PL1 and a second power line PL2. A first power source VDD may be applied to the first power line PL1, and a second power source VSS may be applied to the second power line PL2. The first power source VDD and the second power source VSS may have different potentials such that light emitting elements in the light emitting unit EMU can emit light. In some embodiments, the first power source VDD may be set as a high-potential power source, and the second power source VSS may be set as a low-potential power source. The pixel circuit PXC may use, as a driving power source V_DR, the first power source VDD and the second power source VSS.

Also, the pixel circuit PXC may be electrically connected to the primary inductor LP, and may control a first current I_LP (or primary current) flowing through the primary inductor LP, or may control a voltage applied to both ends of the primary inductor LP by using at least one transistor T. A voltage corresponding to the first current I_LP may be induced in the secondary inductor LS by the transformer TRANS, and a current flowing through the light emitting elements LD in the light emitting unit EMU may be changed according to the first current I_LP. That is, the pixel circuit PXC may control the current flowing through the light emitting elements LD through the transformer TRANS.

A detailed configuration of the pixel circuit PXC will be described later with reference to FIGS. 3, 5, and 7. Meanwhile, although it is illustrated that the transformer TRANS is independent from the pixel circuit PXC, this is for the purpose of describing that the pixel PXL has the transformer TRANS, and the pixel circuit PXC is not limited thereto. For example, the pixel circuit PXC may include the transformer TRANS.

The light emitting unit EMU may be electrically connected to the secondary inductor LS. The light emitting unit EMU may include a first electrode ELT1 (or first pixel electrode), a second electrode ELT2 (or second pixel electrode), and light emitting elements LD. The first electrode ELT1 may be electrically connected to a first terminal of the secondary inductor LS. The second electrode ELT2 may be electrically connected to a second terminal of the secondary inductor LS. The second electrode ELT2 may be connected to the second terminal of the secondary inductor LS through a capacitor C (and/or a resistance). The second power source VSS may be applied to the second electrode ELT2.

The light emitting elements LD may be electrically connected between the first electrode ELT1 and the second electrode ELT2. The light emitting elements LD may include a forward light emitting element LD_F (or forward light emitting elements) and a reverse light emitting element LD_R (or reverse light emitting elements), which are connected in parallel in different directions. The forward light emitting element LD_F may be electrically connected in a first current direction between the first electrode ELT1 and the second electrode ELT2 such that a current flows from the first electrode ELT1 to the second electrode ELT2 through the forward light emitting element LD_F. The reverse light emitting element LD_R may be electrically connected in a second current direction between the first electrode ELT1 and the second electrode ELT2 such that a current flows from the second electrode ELT2 to the first electrode ELT1 through the reverse light emitting element LD_R.

As described above, the pixel PXL can control the current flowing through the light emitting elements LD by using the transformer TRANS (or the primary inductor LP and the secondary inductor LS, which are inductively coupled to each other) (e.g., by using electromagnetic induction). Thus, luminance deterioration caused by a contact resistance (or contact defect) of conductive layers connecting the transistor T in the pixel circuit PXC and the light emitting elements to each other can be reduced or prevented. The contact resistance will be described later with reference to FIG. 8A.

Figure 3:
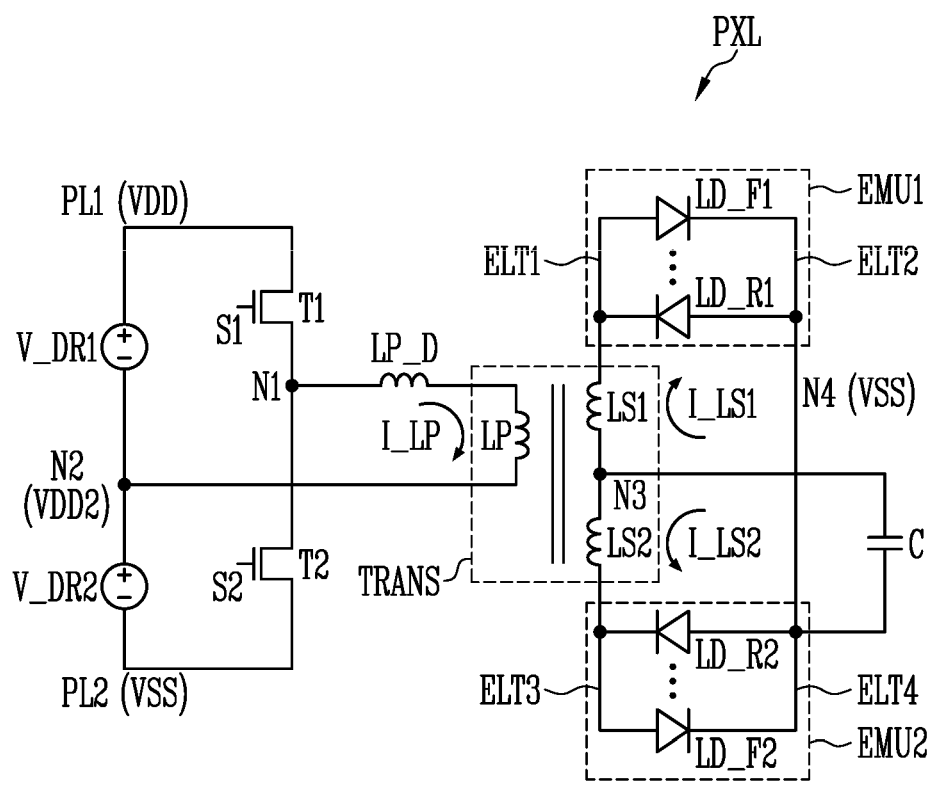
FIG. 3 is a circuit diagram illustrating some embodiments of the pixel shown in FIG. 2.
Figure 4:
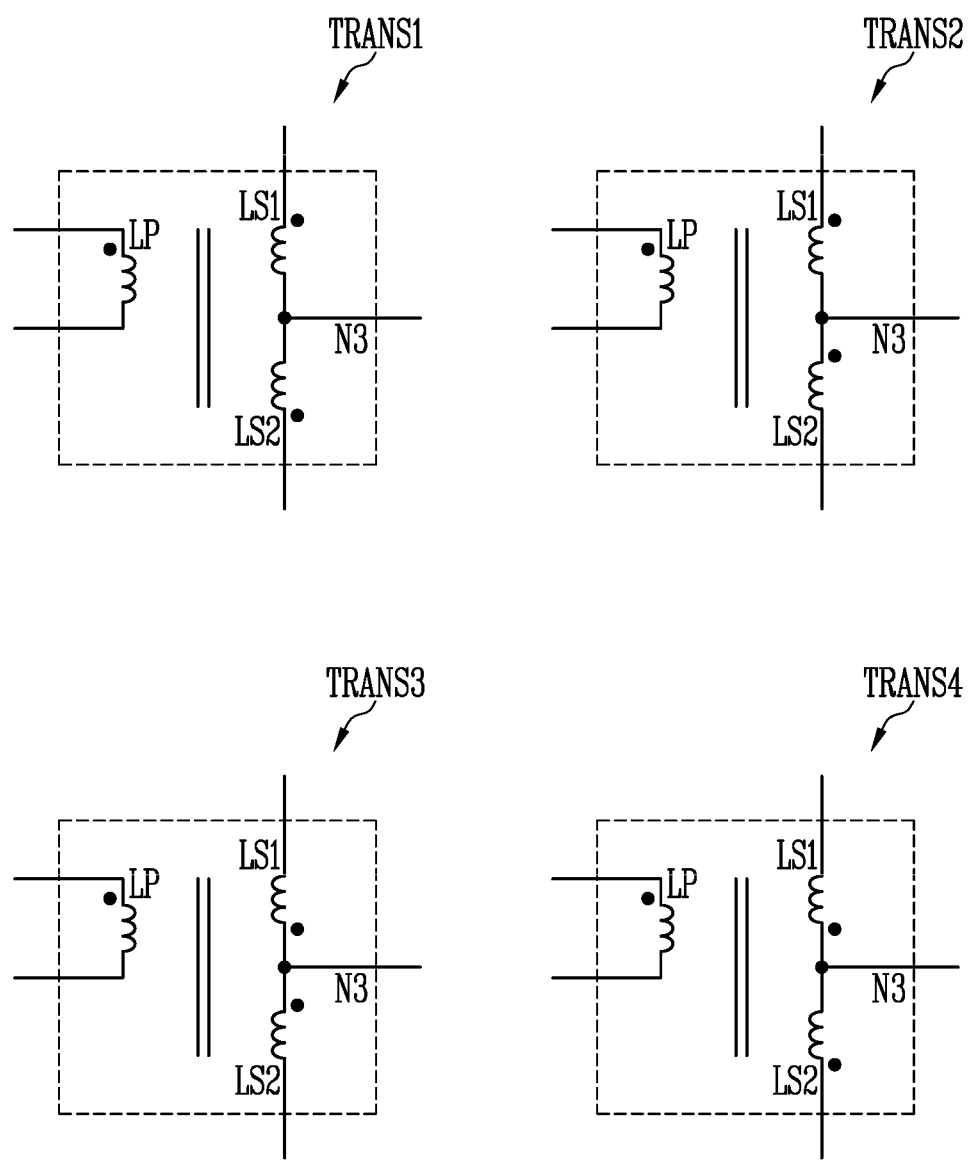
FIG. 4 is a diagram illustrating embodiments of a transformer included in the pixel shown in FIG. 3.

FIG. 3 is a circuit diagram illustrating some embodiments of the pixel shown in FIG. 2. FIG. 4 is a diagram illustrating embodiments of a transformer included in the pixel shown in FIG. 3. FIG. 5 is a circuit diagram illustrating other embodiments of the pixel shown in FIG. 2.

First, referring to FIGS. 1 to 3, a pixel PXL may include a first transistor T1 and a second transistor T2. The first transistor T1 and the second transistor T2 may be included in the pixel circuit PXC (see FIG. 2).

A first terminal of the first transistor T1 may be electrically connected to a first power line PL1, and a second terminal of the first transistor T1 may be electrically connected to a first node N1. One of the first terminal and the second terminal may be a source electrode, and the other of the first terminal and the second terminal may be a drain electrode. A gate electrode of the first transistor T1 may receive a first control signal S1, or may be electrically to a first control line to which the first control signal S1 is applied.

A first terminal of the second transistor T2 may be electrically connected to the first node N1, and a second terminal of the second transistor T2 may be electrically connected to a second power line PL2. A gate electrode of the second transistor T2 may receive a second control signal S2, or may be electrically connected to a second control line to which the second control signal S2 is applied. The first control signal S1 and the second control signal S2 may be provided to the display panel DP (see FIG. 1) from an external device (e.g., a driving circuit such as a data driver or a light emitting driver).

Meanwhile, a primary inductor LP may be electrically connected between the first node N1 and a second node N2. A third power source VDD2 may be applied to the second node N2. The third power source VDD2 may have a potential that is between a first power source VDD and a second power source VSS. For example, the third power source VDD2 may be provided to the display panel DP from an external device, or may be generated by voltage-dividing the first power source VDD and the second power source VSS in the display device DP. A first driving power source V_DR1 may be formed between the first power line PL1 and the second node N2, or a first driving voltage may be applied between the first power line PL1 and the second node N2. A second driving power source V_DR2 may be formed between the second node N2 and the second power line PL2, or a second driving voltage may be applied between the second node N2 and the second power line PL2. As will be described later with reference to FIG. 5, the first driving power source V_DR1 may be used for forward driving, and the second driving power source V_DR2 may be used for reverse driving.

An additional inductor LP_D may be further provided between the first node N1 and the primary inductor LP. The additional inductor LP_D along with the primary inductor LP are provided to adjust the amount of current flowing through the primary inductor LP. In some embodiments, the additional inductor LP_D may be omitted.

When the first transistor T1 is turned on in response to the first control signal S1 having a gate-on voltage level (and when the second transistor T2 is turned off in response to the second control signal S2 having a gate-off voltage level), a first current I_LP in a forward direction may flow through the primary inductor LP from the first driving power source V_DR1.

When the second transistor T2 is turned on in response to the second control signal S2 having the gate-on voltage level (and when the first transistor T1 is turned off in response to the first control signal S1 having the gate-off voltage level), the first current I_LP in a reverse direction may flow through the primary inductor LP from the second driving power source V_DR2.

A transformer TRANS may include a first sub-inductor LS1 (or first secondary inductor) and a second sub-inductor LS2 (or second secondary inductor). The first sub-inductor LS1 and the second sub-inductor LS2 may be included in the secondary inductor LS (see FIG. 2).

A winding direction of the first sub-inductor LS1 may be equal to, or different from, that of the second sub-inductor LS2. In addition, the winding direction of the first sub-inductor LS1 and the winding direction of the second sub-inductor LS2 may be equal to, or different from, that of the primary inductor LP. For example, in a first transformer TRANS1 and a second transformer TRANS2, which are shown in FIG. 4, the winding direction of the first sub-inductor LS1 may be equal to that of the primary inductor LP. In another example, in a third transformer TRANS3 and a fourth transformer TRANS4, which are shown in FIG. 4, the winding direction of the first sub-inductor LS1 may be different from that of the primary inductor LP. For example, in the first transformer TRANS1 and the third transformer TRANS3, which are shown in FIG. 4, the winding direction of the second sub-inductor LS2 may be different from that of the first sub-inductor LS1. In another example, in the second transformer TRANS2 and the fourth transformer TRANS4, which are shown in FIG. 4, the winding direction of the second sub-inductor LS2 may be equal to that of the first sub-inductor LS1. As will be described later with reference to FIG. 5, a first light emitting unit EMU1 and a second light emitting unit EMU2 are alternately driven, and therefore, the winding direction of the first sub-inductor LS1 and the winding direction of the second sub-inductor LS2 are not limited to a specific direction.

Inductances (or winding numbers) of the primary inductor LP, the first sub-inductor LS1, and the second sub-inductor LS2 may be variously changed according to specifications of the pixel PXL. For example, the inductance of each of the primary inductor LP, the first sub-inductor LS1, and the second sub-inductor LS2 may be a few µH (microhenry).

Referring back to FIG. 3, the pixel PXL may include a first light emitting unit EMU1 and a second light emitting unit EMU2. The first light emitting unit EMU1 and the second light emitting unit EMU2 may be included in the light emitting unit EMU (see FIG. 2).

The first light emitting unit EMU1 may be electrically connected to the first sub-inductor LS1. The first light emitting unit EMU1 may include a first electrode ELT1, a second electrode ELT2, and first light emitting elements LD1. The first electrode ELT1 may be electrically connected to a first terminal of the first sub-inductor LS1 (or a third node N3). The second electrode ELT2 may be electrically connected to a second terminal of the first sub-inductor LS1. The second electrode ELT2 may be electrically connected to the second terminal of the first sub-inductor LS1 through a capacitor C (and/or a resistor). The second electrode ELT2 may also be referred to as a fourth node N4. The second power source VSS may be applied to the second electrode ELT2 (or the fourth node N4).

The first light emitting elements LD1 may be electrically connected between the first electrode ELT1 and the second electrode ELT2. The first light emitting elements LD1 may include a first forward light emitting element LD_F1 and a first reverse light emitting element LD_R1, which are connected in parallel in different directions. The first forward light emitting element LD_F1 and the first reverse light emitting element LD_R1 may be connected in different current directions between the first electrode ELT1 and the second electrode ELT2.

The second light emitting unit EMU2 may be electrically connected to the second sub-inductor LS2. The second light emitting unit EMU2 may include a third electrode ELT3, a fourth electrode ELT4, and second light emitting elements LD2. The third electrode ELT3 may be electrically connected to a second terminal of the second sub-inductor LS2. The fourth electrode ELT4 may be electrically connected to a first terminal of the second sub-inductor LS2 (or the third node N3). The fourth electrode ELT4 may be electrically connected to the first terminal of the second sub-inductor LS2 through the capacitor C (and/or the resistor). The fourth electrode ELT4 may be connected to the second electrode ELT2. The fourth electrode ELT4 along with the second electrode ELT2 may be referred to as the fourth node N4. The second power source VSS may be applied to the fourth electrode ELT4.

The second light emitting elements LD2 may be electrically connected between the third electrode ELT3 and the fourth electrode ELT4. The second light emitting elements LD2 may include a second forward light emitting element LD_F2 and a second reverse light emitting element LD_R2, which are connected in parallel in different directions. The second forward light emitting element LD_F2 and the second reverse light emitting element LD_R2 may be connected in different current directions between the third electrode ELT3 and the fourth electrode ELT4.

Meanwhile, although a case where the transformer TRANS includes the first sub-inductor LS1 and the second sub-inductor LS2 at a secondary side thereof has been illustrated in FIG. 3, the transformer TRANS is not limited thereto. Also, although a case where the pixel PXL includes the first light emitting unit EMU1 and the second light emitting unit EMU2 has been illustrated in FIG. 3, the pixel PXL is not limited thereto. As shown in FIG. 5, a transformer TRANS_1 may include only the first sub-inductor LS1 at a secondary side thereof. A pixel PXL_1 may include only the first light emitting unit EMU1 corresponding to the first sub-inductor LS1. When a defect occurs in one light emitting unit EMU, the entire light emitting unit EMU may not emit light, or a current deviation may occur in light emitting elements LD in the light emitting unit EMU. To reduce the likelihood of entire non-emission and to reduce the current deviation, the pixel PXL may include the first and second sub-inductors LS1 and LS2 and the first and second light emitting units EMU1 and EMU2. However, the pixel PXL is not limited thereto. In some embodiments, the pixel PXL may include three or more sub-inductors (e.g., secondary inductors) and three or more light emitting units.

In addition, although a case where the first and second transistors T1 and T2 are implemented with an N-type transistor has been illustrated in FIG. 3, the first and second transistors T1 and T2 are not limited thereto. For example, the first and second transistors T1 and T2 may include an oxide semiconductor or a silicon semiconductor, and may be implemented with a P-type transistor. As described above, the pixel PXL can alternately provide the current in the forward direction and the current in the reverse direction to the light emitting elements LD by using the first and second transistors T1 and T2 and the transformer TRANS.

Figure 6B:
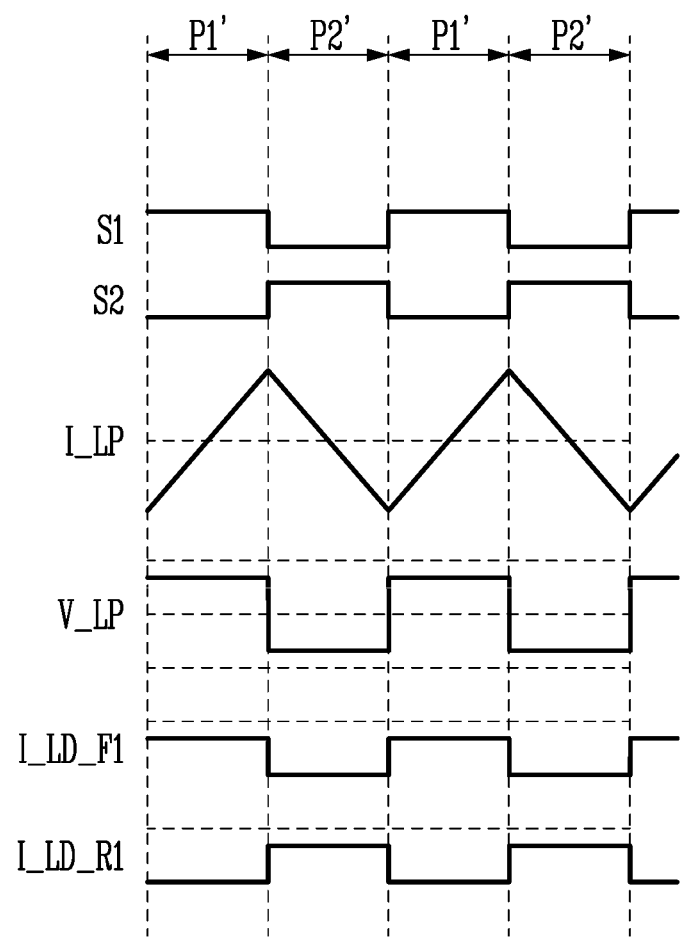

FIGS. 6A and 6B are waveform diagrams illustrating an operation of the pixel shown in FIG. 3.

Referring to FIGS. 3, 6A, and 6B, a first frame FRAME1 may include a first period P1 and a second period P2. The first period P1 and the second period P2 may not overlap with each other. The first period P1 and the second period P2 may be alternately repeated in the first frame FRAME1. A width of the first period P1 may be substantially equal to that of the second period P2.

In the first period P1, the first control signal S1 may have a gate-on voltage level ON (or logic high level), and the second control signal S2 may have a gate-off voltage level OFF (or logic low level). The first transistor T1 may be turned on in response to the first control signal S1 having the gate-on voltage level ON. A first current I_LP in a first current direction may be provided to the primary inductor LP by the first driving power source V_DR1, or the first current I_LP flowing through the primary inductor LP may increase. A primary voltage V_LP corresponding to the first current I_LP may be generated in the primary inductor LP. For example, a positive primary voltage V_LP may be generated as the primary inductor LP is charged.

A secondary voltage corresponding to the primary voltage V_LP may be induced in the first sub-inductor LS1 and the second sub-inductor LS2. When a positive voltage is applied between the first electrode ELT1 and the second electrode ELT2 in response to the secondary voltage, a first forward current I_LD_F1 flows through the first forward light emitting element LD_F1, and the first forward light emitting element LD_F1 may emit light. Meanwhile, a first reverse current I_LD_R1 does not flow through the first reverse light emitting element LD_R1, and the first reverse light emitting element LD_R1 might not emit light.

Similarly, when a positive voltage is applied between the third electrode ELT3 and the fourth electrode ELT4 in response to the secondary voltage, a current flows through the second forward light emitting element LD_F2, and the second forward light emitting element LD_F2 may emit light. Current does not flow through the second reverse light emitting element LD_R2, and the second reverse light emitting element LD_R2 might not emit light.

That is, in the first period P1, a voltage having a first polarity (e.g., a positive voltage) may be induced in the first light emitting unit EMU1 and the second light emitting unit EMU2, and the first forward light emitting element LD_F1 and the second forward light emitting element LD_F2 may emit light in response to the voltage.

In the second period P2, the second control signal S2 may have the gate-on voltage level ON, and the first control signal S1 may have the gate-off voltage level OFF. The second transistor T2 may be turned on in response to the second control signal S2 having the gate-on voltage level ON. A first current I_LP in a second current direction may be provided to the primary inductor LP by the second driving power source V_DR2, or the first current I_LP flowing through the primary inductor LP may decrease. A primary voltage V_LP corresponding to the first current I_LP may be generated in the primary inductor LP. For example, a negative primary voltage V_LP may be generated as the primary inductor LP is discharged.

A secondary voltage corresponding to the primary voltage may be induced in the first sub-inductor LS1 and the second sub-inductor LS2. When a negative voltage is applied between the first electrode ELT1 and the second electrode ELT2 in response to the secondary voltage, a first reverse current I_LD_R1 flows through the first reverse light emitting element LD_R1, and the first reverse light emitting element LD_R1 may emit light. Meanwhile, when the first forward current I_LD_F1 does not flow through the first forward light emitting element LD_F1, and the first forward light emitting element LD_F1 might not emit light.

Similarly, when a negative voltage is applied between the third electrode ELT3 and the fourth electrode ELT4 in response to the secondary voltage, a current may flow through the second reverse light emitting element LD_R2, and the second reverse light emitting element LD_R2 may emit light. Any current does not flow through the second forward light emitting element LD_F2, and the second forward light emitting element LD_F2 might not emit light.

That is, in the second period P2, a voltage having a second polarity (e.g., a negative voltage) may be induced in the first light emitting unit EMU1 and the second light emitting unit EMU2, and the first reverse light emitting element LD_R1 and the second reverse light emitting element LD_R2 may emit light in response to the voltage.

As the first period P1 and the second period P2 are alternately repeated, the primary voltage V_LP in the form of a square wave may be generated, and the first and second forward light emitting elements LD_F1 and LD_F2 and the first and second reverse light emitting elements LD_R1 and LD_R2 may alternately emit light in response to the secondary voltage induced by the primary voltage V_LP. That is, all the light emitting elements LD may contribute to light emission. Thus, the light emission efficiency or luminance of the pixel PXL can be improved. Because the width of the first period P1 is substantially equal to that of the second period P2, each of the first and second forward light emitting elements LD_F1 and LD_F2 and the first and second reverse light emitting elements LD_R1 and LD_R2 may have an emission duty of about 50%. Thus, stress of each of the light emitting elements LD with respect to the same driving condition (e.g., a specific luminance, a specific driving current, etc.) can be decreased, as compared with when only some of light emitting elements emit light (e.g., when only forward light emitting elements contribute to light emission).

Figure 5:
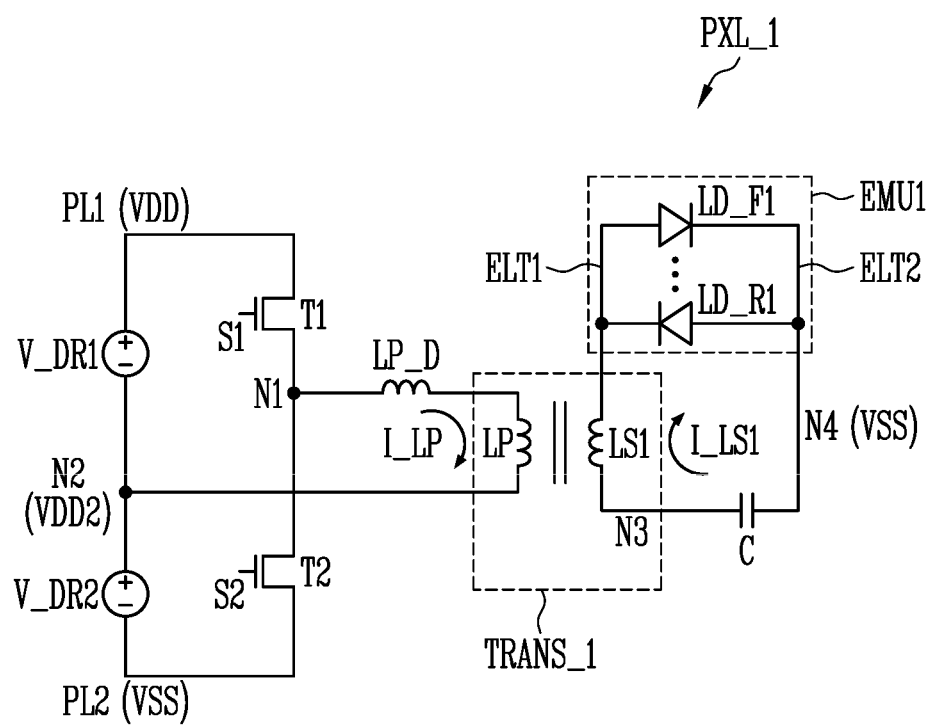
FIG. 5 is a circuit diagram illustrating other embodiments of the pixel shown in FIG. 2.

Meanwhile, although a case where a transition time (e.g., a change time between the gate-on voltage level and the gate-off voltage level) of the first transistor T1 is equal to that of the second transistor T2 has been illustrated in FIG. 5, the present disclosure is not limited thereto. For example, the first transistor T1 may be first changed from the gate-on voltage level to the gate-off voltage level at an end time of the first period P1, and the second transistor T2 may be changed from the gate-off voltage level to the gate-on voltage level at a start time of the second period P2, which is after the end time of the first period. Similarly, the second transistor T2 may be first changed from the gate-on voltage level to the gate-off voltage level at an end time of the second period P2, and the first transistor T1 may be changed from the gate-off voltage level to the gate-on voltage level at a start time of the first period P1, which is subsequent to the end time of the second period P2. That is, the first period P1 and the second period P2 do not overlap with each other. In some embodiments, an interval may exist between the first period P1 and the second period P2.

In some embodiments, the magnitude (or amount) of current induced the light emitting elements LD (or the first and second light emitting units EMU1 and EMU2) may be changed according to a change in the width of the first period P1 and the second period P2. For example, the current flowing through the light emitting elements LD may decrease as the width of the first period P1 and the second period P2 decreases (or as a switching frequency of the first and second transistors T1 and T2 becomes higher). For example, the current flowing through the light emitting elements LD may increase as the width of the first period P1 and the second period P2 increases (or as the switching frequency of the first and second transistors T1 and T2 becomes lower).

Referring to FIG. 6B, a second frame FRAME2 may include a first period P1' and a second period P2'.

A width of the first period P1' may be less than that of the first period P1 shown in FIG. 6A. The first current I_LP charged in the primary inductor LP may decrease, and the magnitude of the primary voltage V_LP generated in the primary inductor LP may become small. Corresponding to this, the magnitude of the first forward current I_LD_F1 flowing through the first forward light emitting element LD_F1 (and the second forward light emitting element LD_F2) may decrease.

Similarly, a width of the second period P2' may be less than that of the second period P2 shown in FIG. 6A. The first current I_LP discharged from the primary inductor LP may decrease, and the magnitude of the primary voltage V_LP generated in the primary inductor LP may become small. Corresponding to this, the magnitude of the first reverse current I_LD_R1 flowing through the first reverse light emitting element LD_R1 (and the second reverse light emitting element LD_R2) may decrease.

That is, the width of the first and second periods P1 and P2 (or the switching frequency of the first and second transistors T1 and T2) are changed, so that the pixel PXL can express various grayscales. In other words, the pixel PXL may be driven by using a pulse frequency modulation (PFM) method of adjusting the turn-on/off time or switching frequency of the first and second transistors T1 and T2, instead of a general method of controlling a voltage applied to a gate electrode of a driving transistor.

As described above, the pixel PXL can be bidirectionally driven by using the first and second transistors T1 and T2, and all the light emitting elements LD can contribute to light emission. Thus, the light emission efficiency of the pixel PXL can be improved, and stress of the light emitting elements LD with respect to the same driving condition can be decreased.

Figure 7:
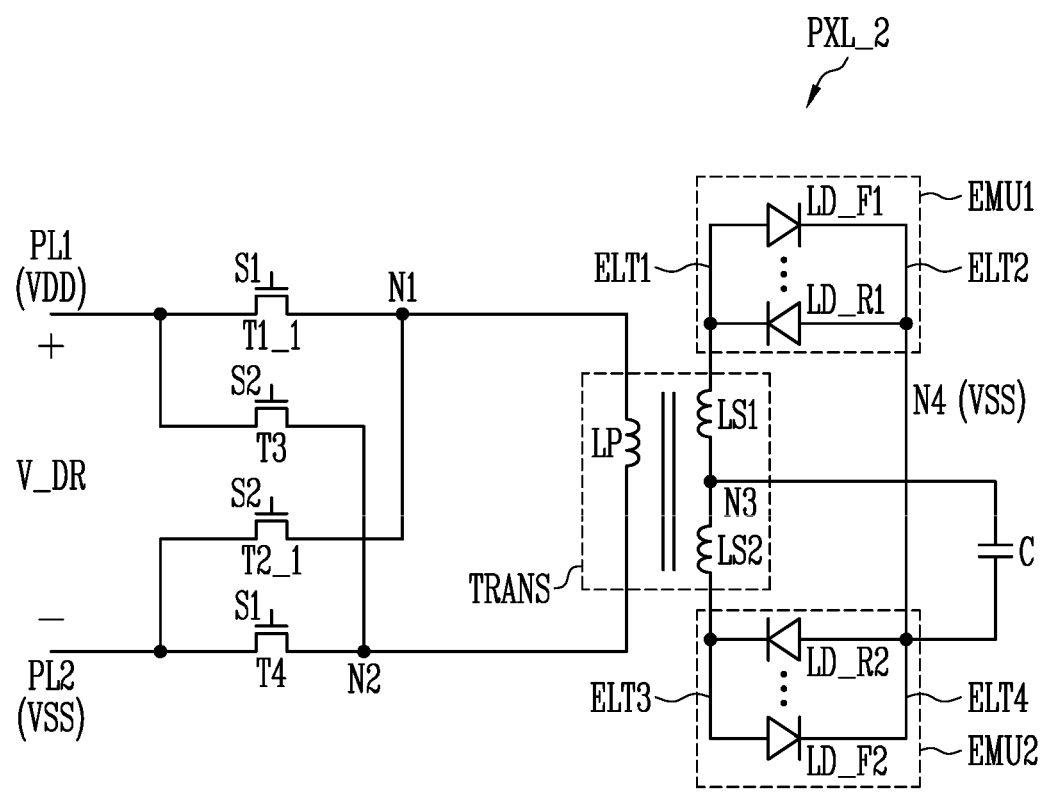
FIG. 7 is a circuit diagram illustrating other embodiments of the pixel shown in FIG. 2.

FIG. 7 is a circuit diagram illustrating other embodiments of the pixel shown in FIG. 2.

Referring to FIGS. 2, 3, and 7, while the pixel PXL shown in FIG. 3 uses two driving power source V_DR1 and V_DR2, a pixel PXL_2 may use one driving power source V_DR. The transformer TRANS and the first and second light emitting units EMU1 and EMU2 have been described with reference to FIG. 3, and therefore, overlapping descriptions will not be repeated.

The pixel PXL_2 may include a first transistor T1_1, a second transistor T2_1, a third transistor T3, and a fourth transistor T4. The first transistor T1_1, the second transistor T2_1, the third transistor T3, and the fourth transistor T4 may be included in the pixel circuit PXC (see FIG. 2).

A first terminal of the first transistor T1_1 may be electrically connected to a first power line PL1, and a second terminal of the first transistor T1_1 may be electrically connected to a first node N1. A gate electrode of the first transistor T1_1 may receive a first control signal S1, or may be electrically connected to a first control line to which the first control signal S1 is applied.

A first terminal of the second transistor T2_1 may be electrically connected to the first node N1, and a second terminal of the second transistor T2_1 may be electrically connected to a second power line PL2. A gate electrode of the second transistor T2_1 may receive a second control signal S2, or may be electrically connected to a second control line to which the second control signal S2 is applied.

A first terminal of the third transistor T3 may be electrically connected to the first power line PL1, and a second terminal of the third transistor T3 may be electrically connected to a second node N2. A gate electrode of the third transistor T3 may receive the second control signal S2, or may be electrically connected to the second control line to which the second control signal S2 is applied.

A first terminal of the fourth transistor T4 may be electrically connected to the second node N2, and a second terminal of the fourth transistor T4 may be electrically connected to the second power line PL2. A gate electrode of the fourth transistor T4 may receive the first control signal S1, or may be electrically connected to the first control line to which the first control signal S1 is applied.

An example will be described with reference to FIG. 6A. In the first period P1, the first control signal S1 may have a gate-on voltage level ON (or logic high level), and the second control signal S2 may have a gate-off voltage level OFF (or logic low level). The first transistor T1_1 and the fourth transistor T4 may be turned on in response to the first control signal S1 having the gate-on voltage level ON. A first current I_LP may flow from the first power line PL1 to the second power line PL2 through the first transistor T1_1, the primary inductor LP, and the fourth transistor T4, or the first current I_LP may increase. Accordingly, a voltage having a first polarity (e.g., a positive voltage) may be applied between the first electrode ELT1 and the second electrode ELT2, and the first forward light emitting element LD_F1 may emit light.

In the second period P2, the second control signal S2 may have the gate-on voltage level ON, and the first control signal S1 may have the gate-off voltage level OFF. The second transistor T2_1 and the third transistor T3 may be turned on in response to the second control signal S2 having the gate-on voltage level ON. A first current I_LP may flow from the first power line PL1 to the second power line PL2 through the third transistor T3, the primary inductor LP, and the second transistor T2_1, or the first current I_LP may decrease. Accordingly, a voltage having a second polarity (e.g., a negative voltage) may be applied between the first electrode ELT1 and the second electrode ELT2, and the first reverse light emitting element LD_R1 may emit light.

As described above, the pixel circuit PXC (see FIG. 2) may be variously implemented within a range in which the first current I_LP can be alternately provided in the forward and reverse directions to the primary inductor LP.

Figure 8A:
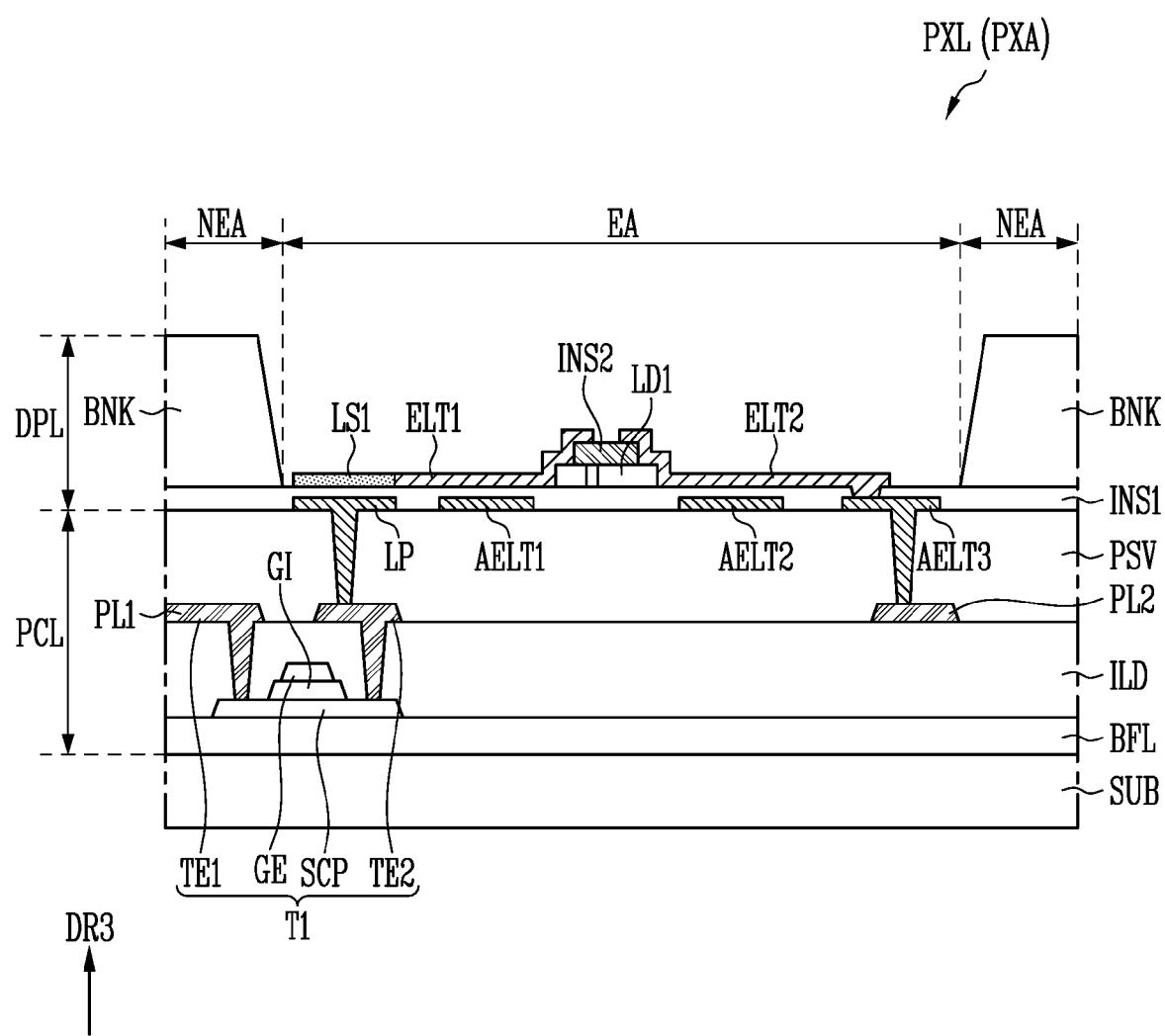
FIGS. 8A, 8B, and 8C are sectional views illustrating some embodiments of the pixel shown in FIG. 3.
Figure 8B:
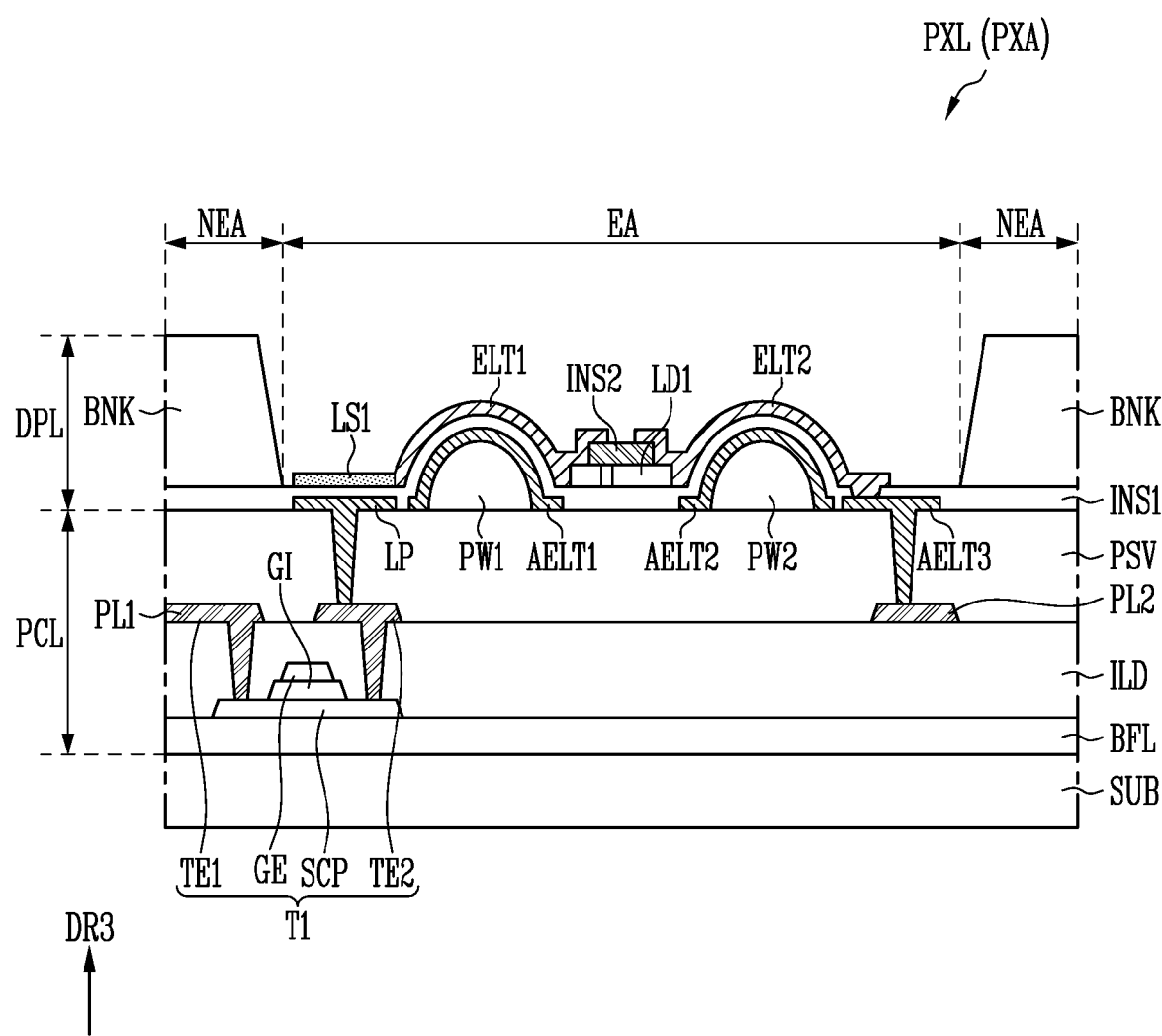
Figure 8C:
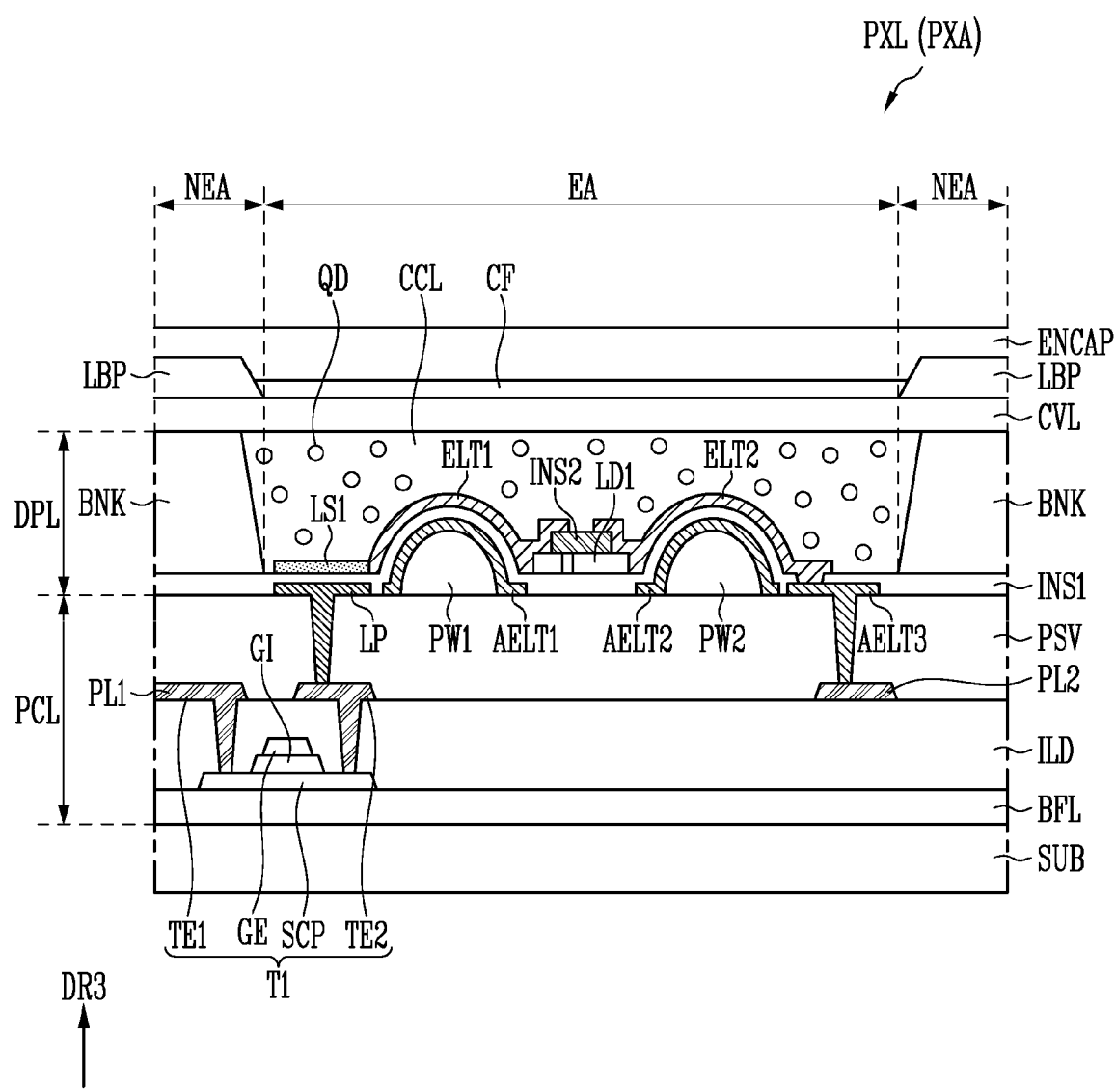

FIGS. 8A, 8B, and 8C are sectional views illustrating some embodiments of the pixel shown in FIG. 3. In FIGS. 8A to 8C, a pixel PXL is briefly illustrated based on a first transistor T1 and first and second electrodes ELT1 and ELT2. The structure of the second transistor T2 shown in FIG. 3 may be substantially identical or similar to that of the first transistor T1, and the structure of the third and fourth electrodes ELT3 and ELT4 shown in FIG. 3 may be substantially identical or similar to that of the first and second electrodes ELT1 and ELT2, respectively. Also, in FIGS. 8A to 8C, the pixel PXL is simplified and illustrated, such as a case where each electrode is illustrated as only a single-layered electrode and a case where each of a plurality of insulating layers is illustrated as only a single-layered insulating layer. However, the present disclosure is not limited thereto.

In some embodiments of the present disclosure, as long as any other description is not provided, the term "being formed and/or provided in the same layer" may mean being formed in the same process, and the term "being formed and/or provided in different layers" may mean being formed in different processes.

Referring to FIGS. 1 to 3 and 8A to 8C, in a pixel area PXA, a pixel circuit layer PCL and a display element layer DPL (or light emitting element layer) may be sequentially located on the substrate SUB. In some embodiments, the pixel circuit layer PCL and the display element layer DPL may be entirely formed in the display area DA of the display panel DP (see FIG. 1).

The pixel circuit layer PCL may include a buffer layer BFL, a first transistor T1, and a protective layer PSV. As shown in FIGS. 8A to 8C, the buffer layer BFL, the first transistor T1, and the protective layer PSV may be sequentially stacked on the substrate SUB.

The buffer layer BFL may reduce or prevent impurities being diffused into the first transistor T1. The buffer layer BFL may be an inorganic insulating layer including an inorganic material. The buffer layer BFL may include, for example, at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided as a single layer, but may be provided as a multi-layer including at least two layers. When the buffer layer BFL is provided as the multi-layer, the layers may be formed of the same material or may be formed of different materials. The buffer layer BFL may be omitted according to the material and process conditions of the substrate SUB.

The first transistor T1 may include a semiconductor pattern SCP, a gate electrode GE, a first terminal TE1, and a second terminal TE2. The first terminal TE1 may be any one of a source electrode and a drain electrode, and the second terminal TE2 may be the other of the source electrode and the drain electrode. In some embodiments, when the first terminal TE1 is the drain electrode, the second terminal TE2 may be the source electrode.

The semiconductor pattern SCP may be provided and/or formed on the buffer layer BFL. The semiconductor pattern SCP may include a first contact region in contact with the first terminal TE1 and a second contact region in contact with the second terminal TE2. A region between the first contact region and the second contact region may be a channel region. The channel region may overlap with the gate electrode GE of the corresponding transistor T. The transistor semiconductor pattern SCP may be a semiconductor pattern made of amorphous silicon, poly-silicon, low temperature poly-silicon, an oxide semiconductor, an organic semiconductor, or the like. The channel region is a semiconductor pattern undoped with an impurity, and may be an intrinsic semiconductor. Each of the first contact region and the second contact region may be a semiconductor pattern doped with the impurity.

A gate insulating layer GI may be provided and/or formed over the semiconductor pattern SCP. The gate insulating layer GI may be an inorganic insulating layer including an inorganic material. In some embodiments, the gate insulating layer GI may include the same material as the buffer layer BFL or may include at least one material selected from the materials described as the material constituting the buffer layer BFL. In some embodiments, the gate insulating layer GI may be an organic insulating layer including an organic material. The gate insulating layer GI may be provided as a single layer, but may be provided as a multi-layer including at least two layers.

The gate electrode GE may be provided and/or formed on (e.g., under) a gate insulating layer GI to correspond to the channel region of the semiconductor pattern SCP. The gate electrode GE may be provided on the gate insulating layer GI to overlap with the channel region of the semiconductor pattern SCP. The gate electrode GE may be formed in a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof, or may be formed in a double- or multi-layered structure including molybdenum (Mo), titanium (Ti), copper (Cu), aluminum (Al) or silver (Ag), which is a low-resistance material so as to decrease wiring resistance.

An interlayer insulating layer ILD may be provided and/or formed over the gate electrode GE. The interlayer insulating layer ILD may include the same material as the gate insulating layer GI or may include at least one material selected from the materials described as the material constituting the gate insulating layer GI.

Each of the first terminal TE1 and the second terminal TE2 may be provided and/or formed on the interlayer insulating layer ILD, and the first terminal TE1 and the second terminal TE2 may be respectively in contact with the first contact region and the second contact region of the semiconductor pattern SCP through contact holes penetrating the interlayer insulating layer ILD. Each of the first terminal TE1 and the second terminal TE2 may include the same material as the gate electrode GE or may include at least one material selected from the materials described as the material constituting the gate electrode GE.

In the above-described embodiments, it has been described that the first and second terminals TE1 and TE2 of the first transistor T1 are separate electrodes electrically connected to the semiconductor pattern SCP through contact holes penetrating the interlayer insulating layer ILD, but the present disclosure is not limited thereto. In some embodiments, the first terminal TE1 of the transistor T may be the first contact region adjacent to the channel region of the corresponding semiconductor pattern SCP, and the second terminal TE2 of the transistor T may be the second contact region adjacent to the channel region of the corresponding semiconductor pattern SCP.

Although a case where the first transistor T1 is a thin film transistor having a top gate structure has been described as an example in FIGS. 8A to 8C, the present disclosure is not limited thereto, and the structure of the first transistor T1 may be variously modified. For example, the transistor T may have a bottom gate structure, a dual gate structure, or a double gate structure. In some embodiments, the first transistor T1 may selectively further include a bottom metal layer (e.g., lower electrode, back gate electrode, or light blocking layer) overlapping with the semiconductor pattern SCP with the buffer layer BFL interposed therebetween.

A first power line PL1 and a second power line PL2 may be provided and/or formed on the interlayer insulating layer ILD. The first power line PL1 may be connected to the first terminal TE1 of the first transistor T1. Each of the first power line PL1 and the second power line PL2 may include the same material as the first and second terminals TE1 and TE2.

The protective layer PSV may be provided and/or formed over the first transistor T1.

The protective layer PSV may be provided in a form including an organic insulating layer, an inorganic insulating layer, or the organic insulating layer located on the inorganic insulating layer. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). For example, the organic insulating layer may include at least one of polyacrylates resin, epoxy resin, phenolic resin, polyamides resin, polyimides resin, unsaturated polyesters resin, poly-phenylene ethers resin, poly-phenylene sulfides resin, and benzocyclobutenes resin.

The display element layer DPL may be provided on the protective layer PSV.

Referring to FIG. 8B, the display element layer DPL may include a primary inductor LP, a first alignment electrode AELT1, a second alignment electrode AELT2, a bridge electrode AELT3, a first insulating layer INS1, a bank BNK, a first sub-inductor LS1 (or secondary inductor LS, as shown in FIG. 3), a first electrode ELT1, a second electrode ELT2, and a first light emitting element LD1.

The primary inductor LP, the first alignment electrode AELT1, the second alignment electrode AELT2, and the bridge electrode AELT3 may be located on the first insulating layer INS1. The bank BNK, the first sub-inductor LS1, the first electrode ELT1, and the second electrode ELT2 may be located on the first insulating layer INS1. The first light emitting element LD1 may be located between the first insulating layer INS1 and the first and second electrodes ELT1 and ELT2.

The first alignment electrode AELT1 and the second alignment electrode AELT2 may be located on the protective layer PSV to be spaced apart from each other. The primary inductor LP is located at one side of the first alignment electrode AELT1, and may be spaced apart from the first alignment electrode AELT1. Similarly, the bridge electrode AELT3 may be located at the other side of the second alignment electrode AELT2. The bridge electrode AELT3 may be spaced apart from the second alignment electrode AELT2, but the present disclosure is not limited thereto. For example, the bridge electrode AELT3 may be connected to the second alignment electrode AELT2 or may be integrally formed with the second alignment electrode AELT2.

The first alignment electrode AELT1 and the second alignment electrode AELT2 may include a material having a constant reflexibility to allow light emitted from the first light emitting element LD to generally advance in the third direction DR3. For example, the first alignment electrode AELT1 and the second alignment electrode AELT2 may include metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. For example, the first alignment electrode AELT1 and the second alignment electrode AELT2 may include aluminum (Al) having a relatively high reflexibility. The first alignment electrode AELT1 and the second alignment electrode AELT2 may be configured as a single layer or a multi-layer.

The primary inductor LP and the bridge electrode AELT3 may be formed through the same process as the first and second alignment electrodes AELT1 and AELT2, and may include the same material (e.g., aluminum (Al)) as the first and second alignment electrodes AELT1 and AELT2.

In some embodiments, the display element layer DPL may further include first and second patterns PW1 and PW2 (e.g., bank patterns, wall patterns, or protrusion patterns) located on the bottom of the first and second alignment electrodes AELT1 and AELT2.

The first pattern PW1 may be located on the bottom of the first alignment electrode AELT1 to overlap with the first alignment electrode AELT1. The second pattern PW2 may be located on the bottom of the second alignment electrode AELT2 to overlap with the second alignment electrode AELT2.

When the first and second patterns PW1 and PW2 are respectively provided on the bottom of the first and second alignment electrodes AELT1 and AELT2, one areas of the first and second alignment electrodes AELT1 and AELT2 may protrude in the third direction DR3 in areas in which the first and second patterns PW1 and PW2 are formed. Accordingly, a wall structure may be formed at the periphery of the first light emitting element LD1.

In some embodiments, when the first and second patterns PW1 and PW2 and the first and second alignment electrodes AELT1 and AELT2 include a reflective material, a reflective wall structure may be formed at the periphery of the first light emitting element LD1. Accordingly, light emitted from the first light emitting element LD1 further faces in an upper direction of the pixel PXL (e.g., a front direction of the display panel DP, which includes a predetermined viewing angle range), thereby improving the light efficiency of the pixel PXL.

The first and second patterns PW1 and PW2 may have various shapes. In some embodiments, the first and second patterns PW1 and PW2 may have a section having a semicircular shape, a semi-elliptical shape, or the like. In other embodiments, the first and second patterns PW1 and PW2 may have an inclined surface inclined at an angle of a predetermined range with respect to the substrate SUB, or have side surfaces having a stepped shape or the like. The first and second alignment electrodes AELT1 and AELT2 (and the first and second electrodes ELT1 and ELT2) located on the top of the first and second patterns PW1 and PW2, and the first insulating layer INS1 may have a surface profile corresponding to the first and second patterns PW1 and PW2.

The first and second patterns PW1 and PW2 may include an insulating material including at least one inorganic material and/or at least one organic material. In some embodiments, the first and second patterns PW1 and PW2 may include at least one inorganic layer including various inorganic insulating materials, including silicon nitride ($SiN_x$), silicon oxide ($SiO_x$), silicon oxynitride ($SiO_xN_y$), and the like. Alternatively, the first and second patterns PW1 and PW2 may include at least one organic layer including various organic insulating materials, including a photoresist material and the like, or may be configured as an insulator having a single layer or a multi-layer, which includes a combination of organic/inorganic materials.

The first insulating layer INS1 may be formed to completely cover the primary inductor LP, the first alignment electrode AELT1, the second alignment electrode AELT2, and the bridge electrode AELT3. The first insulating layer INS1 may be an inorganic insulating layer including an inorganic material or an organic insulating layer including an organic material, but the material of the first insulating layer INS1 is not limited to the above-described embodiments.

The bank BNK may be provided in a non-emission area NEA to surround an emission area EA. The bank BNK may form a dam structure defining each emission area to which light emitting elements LD are to be supplied in a process of supplying the light emitting elements LD to each pixel PXL. For example, each emission area EA is partitioned by the bank BNK, so that a desired kind and/or a desired amount of light emitting element ink may be supplied to the emission area EA.

The bank BNK may include at least one light blocking material and/or at least one reflective material, and accordingly, light leakage between adjacent pixels PXL can be reduced or prevented. For example, the bank BNK may include at least one black matrix material and/or at least one color filter material. In some embodiments, the bank BNK may be formed as a black opaque pattern capable of blocking transmission of light. In some embodiments, a reflective layer or the like may be formed on a surface (e.g., a sidewall) of the bank BNK to increase the light efficiency of each pixel PXL.

The first light emitting element LD1 may be located or aligned between the first and second patterns PW1 and PW2 or between the first and second electrodes ELT1 and ELT2.

In some embodiments, a plurality of light emitting elements LD may be supplied to the emission area EA of the pixel PXL through an inkjet process, a slit coating process or other various processes, and an alignment signal (e.g., a predetermined alignment signal, or alignment voltage) may be applied to the first and second alignment electrodes AELT1 and AELT2, thereby aligning the light emitting elements LD between the first and second alignment electrodes AELT1 and AELT2.

A second insulating layer INS2 (or second insulating pattern) may be located on one area of the first light emitting element LD. The second insulating layer INS2 may be locally located the one area of the light emitting element LD1 to expose both end portions of the first light emitting element LD1.

Both the end portions of the first light emitting element LD1, which are not covered by the second insulating layer INS2, may be respectively connected to the first and second electrodes ELT1 and ELT2. When the second insulating layer INS2 is formed on the first light emitting element LD1 after the first light emitting element LD1 is completely aligned, the first light emitting element LD1 can be stably fixed.

The second insulating layer INS2 may include at least one inorganic insulating material and/or at least one organic insulating material. For example, the second insulating layer INS2 may include various kinds of organic/inorganic insulating materials known in the art, including silicon nitride (SiN$_x$), and the material constituting the second insulating layer INS2 is not particularly limited.

The first and second electrodes ELT1 and ELT2 are located on the first insulating layer INS1, and may be spaced part from each other with the second insulating layer INS2 interposed therebetween. The first and second electrodes ELT1 and ELT2 may be concurrently or substantially simultaneously formed, or may be formed through different processes.

The first electrode ELT1 may be formed on/above the first alignment electrode AELT1 and on a first end portion of the first light emitting element LD1, and may be in contact with the first end portion of the first light emitting element LD1. Similarly, the second electrode ELT2 may be formed on/above the second alignment electrode AELT2 and on a second end portion of the first light emitting element LD1, and may be in contact with the second end portion of the first light emitting element LD1.

Also, the first electrode ELT1 may be connected or coupled to the first sub-inductor LS1. The second electrode ELT2 may be in contact with the bridge electrode AELT3 through a contact hole penetrating the first insulating layer INS1, and may be electrically connected to the second power line PL2 through the bridge electrode AELT3.

The first and second electrodes ELT1 and ELT2 may be made of various transparent conductive materials. In some embodiments, the first and second electrodes ELT1 and ELT2 may include at least one of various transparent conductive materials, including ITO, IZO, ITZO, ZnO, AZO, GZO, ZTO, GTO, and FTO, and may be implemented to be substantially transparent or translucent to satisfy a corresponding transmittance (e.g., a predetermined transmittance). Accordingly, light emitted from both the end portions of the first light emitting element LD1 can be transmitted through the first and second electrodes ELT1 and ELT2, and then may advance toward the outside of the pixel PXL (e.g., in the third direction DR3).

The first sub-inductor LS1 (or the secondary inductor (see FIG. 3)) may overlap with the primary inductor LP with the first insulating layer INS1 interposed therebetween. The second sub-inductor LS1 may be concurrently or substantially simultaneously formed with the first electrode ELT1 or the second electrode ELT2, but may be formed through different processes. The first sub-inductor LS1 may include the same material as the first and second electrodes ELT1 and ELT2. In some embodiments, the first sub-inductor LS1 may include a material having a high magnetic permeability, such as a ferrite particle (or nano ferrite). The magnetism of the first sub-inductor LS1 can be more effectively maintained.

The first electrode ELT1 may be electrically connected to the first transistor T1 through the first sub-inductor LS1 and the primary inductor LP, which are inductively coupled to each other.

In a display device in accordance with a comparative example, the first electrode ELT1 may be in contact with the first alignment electrode AELT1 through a contact hole penetrating the first insulating layer INS1, and may be connected to the first transistor T1 through the first alignment electrode AELT1. When the first alignment electrode AELT1 includes a reflective material (e.g., aluminum (Al)) so as to increase the light emission efficiency of the pixel PXL, a contact defect may occur between the first alignment electrode AELT1 and the first electrode ELT1, and contact resistance between the first alignment electrode AELT1 and the first electrode ELT1 may increase. For example, aluminum (Al) included in the first alignment electrode AELT1 may be oxidized, or gas may be generated in other manufacturing processes. Therefore, a phenomenon may occur, in which the first electrode ELT1 is lifted (or spaced apart) from the first alignment electrode AELT1 due to the oxidation or the gas. That is, the first electrode ELT1 may be abnormally in contact with the first alignment electrode AELT1. As the contact resistance increases, a desired current does not flow through the first light emitting element LD1, and the light emission efficiency of the pixel PXL may be deteriorated. Alternatively, the first alignment electrode AELT1 may include another material in addition to aluminum (Al). However, the reflexibility of the first alignment electrode AELT1 may be lowered, and accordingly, the light emission efficiency of the pixel PXL may be deteriorated.

Therefore, in the pixel PXL in accordance with the embodiments of the present disclosure, the first electrode ELT1 is not in contact with the first alignment electrode AELT1, but may be electrically connected to the first transistor T1 by using the first sub-inductor LS1 (or the secondary inductor LS) and the primary inductor LP, which are inductively coupled to each other. Thus, the deterioration of the light emission efficiency of the pixel PXL can be reduced or prevented. Because the first electrode ELT1 is not in contact with the first alignment electrode AELT1, a contact hole otherwise existing to allow the first electrode ELT1 and the first alignment electrode AELT1 to be in contact with each other (e.g., a contact hole penetrating the first insulating layer INS1) may be omitted.

In addition, the primary inductor LP may be formed through the same process as the first alignment electrode AELT1, and the first sub-inductor LS1 (or the secondary inductor LS) may be formed through the same process as the first electrode ELT1 or the second electrode ELT2. Thus, any additional process for forming the primary inductor LP and the first sub-inductor LS1 (or the secondary inductor LS) is not required.

In some embodiments, the first sub-inductor LS1 may be located in the emission area EA. The bank BNK may be formed before the first light emitting element LD1 is arranged, and the first sub-inductor LS1 may be formed together with the first electrode ELT1 or the second electrode ELT2 after the first light emitting element LD1 is arranged. The first sub-inductor LS1 may be located in the emission area EA. However, the present disclosure is not limited thereto, and the first sub-inductor LS1 may be located while overlapping with the bank BNK. A case where the first sub-inductor LS1 overlaps with the bank BNK will be described later with reference to FIG. 10B.

In some embodiments, the pixel PXL may further include a light conversion pattern layer located on the display element layer DPL.

Referring to FIG. 8C, the light conversion pattern layer may include a color conversion layer CCL, a cover layer CVL, a light blocking pattern LBP, a color filter CF, and an encapsulation layer ENCAP.

The color conversion layer CCL may be located while overlapping with the emission area EA. For example, the color conversion layer CCL may be located in an opening of the bank BNK, but the present disclosure is not limited thereto. For example, the color conversion layer CCL along with the color filter CF may be located on the cover layer CVL.

The color conversion layer CCL may include color conversion particles QD corresponding to a specific color.

The color conversion particles QD may convert light emitted from the first light emitting element LD1 into light of a corresponding color. In some embodiments, when the pixel PXL is a red pixel, the color conversion layer CCL may include color conversion particles QD of a red quantum dot for converting light (e.g., light of a first color) emitted from the first light emitting element LD1 into light of a red color (or light of a second color). In addition, when the pixel PXL is a green pixel, the color conversion layer CCL may include color conversion particles QD of a green quantum dot for converting light (e.g., light of a first color) emitted from the first light emitting element LD1 into green light (or light of a second color). Additionally, when the pixel PXL is a blue pixel, the color conversion layer CCL may include color conversion particles QD of a blue quantum dot for converting light (e.g., light of a first color) emitted from the first light emitting element LD1 into blue light (or light of a second color). In some embodiments, the pixel PXL may include a light scattering layer including light scattering particles instead of the color conversion layer CCL including the color conversion particles QD. In some embodiments, when the first light emitting element LD1 emits blue light or blue series light, the pixel PXL may include a light scattering layer including light scattering particles. In some embodiments, the above-described light scattering layer may be omitted. In other embodiments, the pixel PXL may include transparent polymer instead of the color conversion layer CCL.

The cover layer CVL may entirely cover the emission area EA and the non-emission area NEA, thereby blocking moisture, humidity, or the like from being introduced into the first light emitting element LD1 from the outside. The cover layer CVL may have a structure in which at least one inorganic insulating layer and at least one organic insulating layer are alternately stacked.

In some embodiments, may be a transparent adhesive layer (or cohesive layer (e.g., an optically clear adhesive (OCA)) for reinforcing adhesion between an upper configuration and a lower configuration, but the present disclosure is not limited thereto. In other embodiments, the cover layer CVL may be a refractive index conversion layer for converting the refractive index of light that is emitted from the first light emitting element LD1 and that then advances in the third direction DR3, thereby improving the emission luminance of the pixel PXL. In still other embodiments, the cover layer CVL may be made of a thermosetting resin and/or a photocurable resin to be coated in a liquid form on the display element layer DPL, and then to be cured through a curing process using heat and/or light.

The light blocking pattern LBP may be provided on the cover layer CVL.

The light blocking pattern LBP may include a light blocking material that reduces or prevents a light leakage defect in which light (or beam) is leaked between the pixel PXL and pixels adjacent thereto. The light blocking pattern LBP may be a black matrix. The light blocking pattern LBP may reduce or prevent mixture of lights emitted from the respective adjacent pixels. In some embodiments, the light blocking pattern LBP may include at least one light blocking material and/or at least one reflective material to allow light emitted from the first light emitting element LD1 located in the emission area EA to further advance in the third direction DR3, thereby improving the light emission efficiency of the first light emitting element LD1.

The above-described light blocking pattern LBP may be provided in the non-emission area NEA, which excludes the emission area EA. The light blocking pattern LBP may be a dam structure that is located on the cover layer CVL to define the emission area EA in which the color filter CF (or the color conversion layer CCL) is to be supplied.

The color filter CF may fill a space surrounded by the light blocking pattern LBP. The color filter CF may allow light of the corresponding color to be selectively transmitted therethrough. The color filter CF is located on one surface of the color conversion layer CCL of the pixel PXL, and may include a color filter material for allowing light of a corresponding color, which is converted in the color conversion layer CCL, to be selectively transmitted therethrough. When the pixel PXL is a red pixel, the color filter CF may include a red color filter. In addition, when the pixel PXL is a green pixel, the color filter CF may include a green color filter. In addition, when the pixel PXL is a blue pixel, the color filter CF may include a blue color filter.

The encapsulation layer ENCAP may be entirely provided and/or formed on the color filter CF and the light blocking pattern LBP (e.g., over an entirety thereof).

The encapsulation layer ENCAP may be a protective layer covering components located on the bottom thereof (e.g., such as the color filter CF). The encapsulation layer ENCAP may be an inorganic insulating layer including an inorganic material, or an organic insulating layer including an organic material, but the material of the encapsulation layer ENCAP is not limited to the above-described embodiments. In some embodiments, the encapsulation layer ENCAP may be a planarization layer that reduces a step difference caused by components located on the bottom thereof.

The pixel PXL emits light having excellent color reproduction through the light conversion pattern layer, so that the light emission efficiency of the pixel PXL can be improved.

As described above, in the pixel PXL, the first electrode ELT1 is not in contact with the first alignment electrode AELT1, but may be electrically connected to the first transistor T1 by using the first sub-inductor LS1 (or the secondary inductor LS) and the primary inductor LP, which are inductively coupled to each other. Thus, the deterioration of the light emission efficiency of the pixel PXL can be reduced or prevented.

Figure 9A:
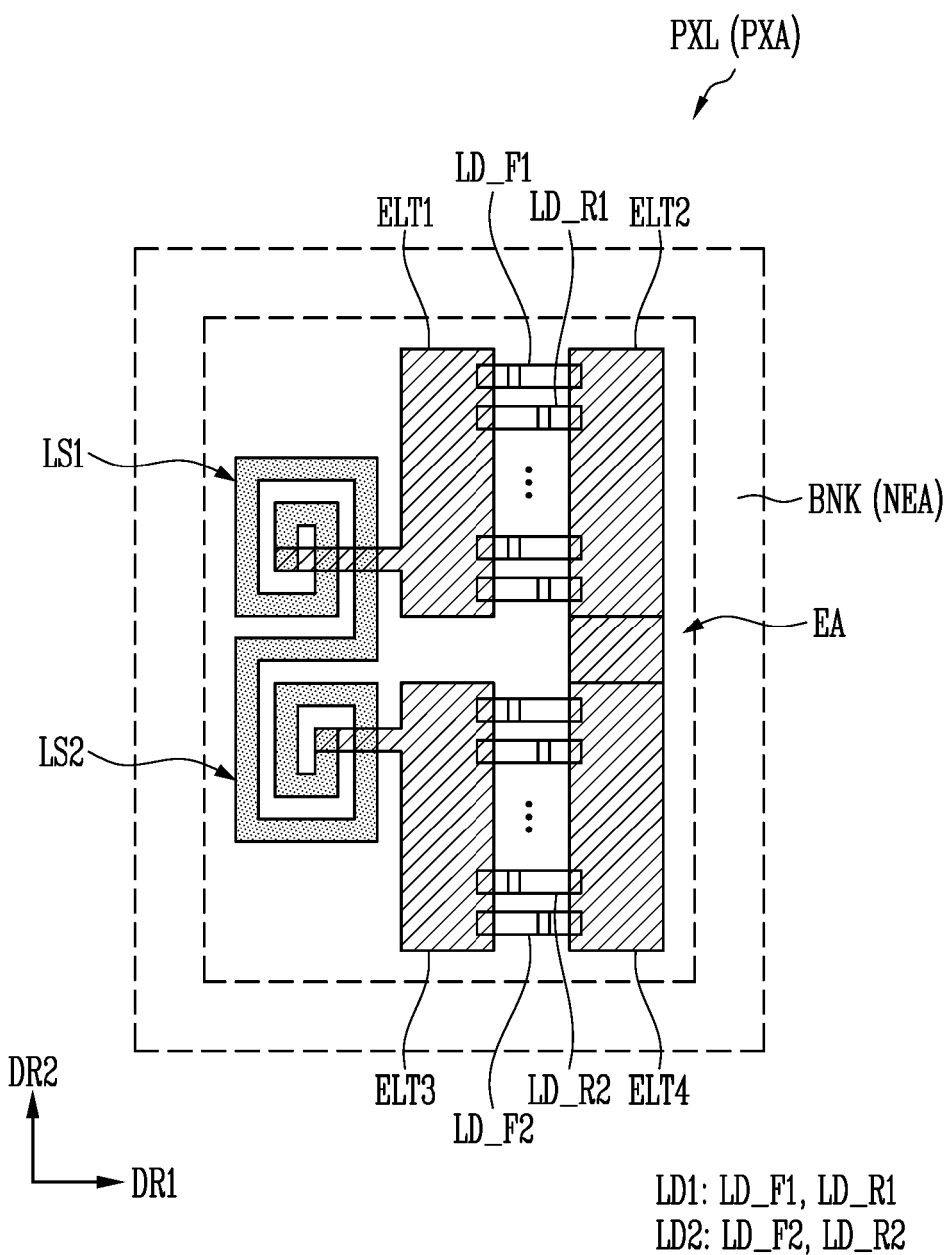
FIGS. 9A and 9B are plan views illustrating some embodiments of the pixel shown in FIG. 3.
Figure 9B:
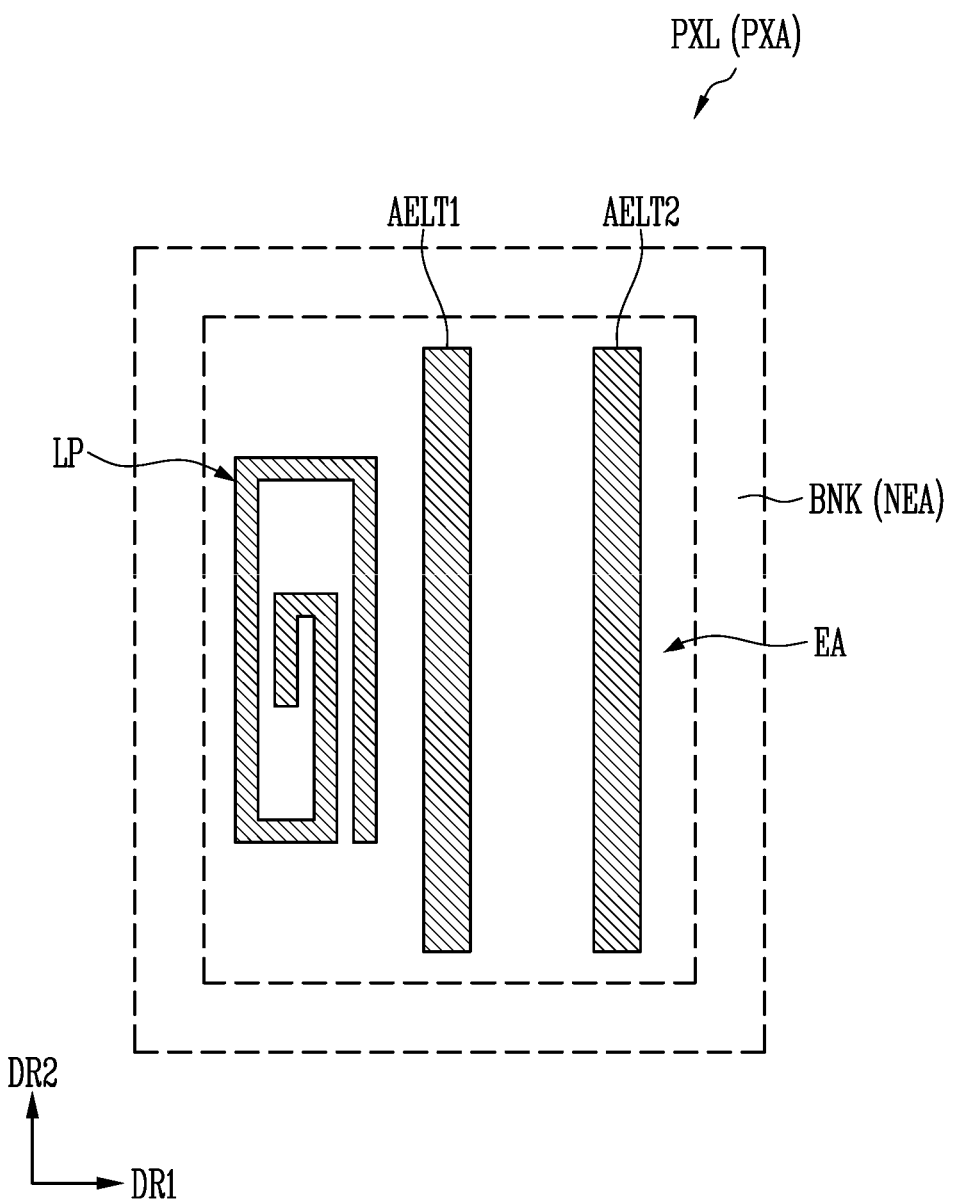

FIGS. 9A and 9B are plan views illustrating some embodiments of the pixel shown in FIG. 3. The first sub-inductor LS1 and the first and second electrodes ELT1 and ELT2, which are included in the pixel PXL shown in FIGS. 8A to 8C, are illustrated in FIG. 9A, and the primary inductor LP and the first and second alignment electrodes AELT1 and AELT2, which are included in the pixel PXL shown in FIGS. 8A to 8C, are illustrated in FIG. 9B.

Referring to FIGS. 1 to 3, 8A to 8C, 9A, and 9B, first to fourth electrodes ELT1 to ELT4 may be located in an emission area EA of a pixel area PXA.

For example, the first electrode ELT1 and the second electrode ELT2 may be located in the second direction DR2 with respect to the area center of the emission area EA (e.g., toward a top of the emission area EA in a plan view). The first electrode ELT1 and the second electrode ELT2 may extend in the second direction DR2, and may be spaced apart from each other along the first direction DR1. First light emitting elements LD1 (e.g., a first forward light emitting element LD_F1 and a first reverse light emitting element LD_R1) may be located between the first electrode ELT1 and the second electrode ELT2.

For example, the third electrode ELT3 and the fourth electrode ELT4 may be located in the opposite direction of the second direction DR2 with respect to the area center of the emission area EA (e.g., toward a bottom of the emission area EA in a plan view). The third electrode ELT3 and the fourth electrode ELT4 may extend in the second direction DR2, and may be spaced apart from each other along the first direction DR1. Second light emitting elements LD2 (e.g., a second forward light emitting element LD_F2 and a second reverse light emitting element LD_R2) may be located between the third electrode ELT3 and the fourth electrode ELT4. In some embodiments, the fourth electrode ELT4 may extend up to the second electrode ELT2, and the second electrode ELT2 and the fourth electrode ELT4 may be integrally formed.

The arrangement positions of the first to fourth electrodes ELT1 to ELT4 are not limited to those shown in FIG. 9A. For example, the first to fourth electrodes ELT1 to ELT4 may be sequentially arranged along the first direction DR1.

A first sub-inductor LS1 and a second sub-inductor LS2 may be located at respective sides of the first and third electrodes ELT1 and ELT3. Because the first sub-inductor LS1 is connected to the first electrode ELT1, the first sub-inductor LS1 may be located adjacent to the first electrode ELT1. For example, the first sub-inductor LS1 may be located in the opposite direction of the first direction DR1 with respect to the first electrode ELT1 (e.g., to the left of the first electrode ELT1). Similarly, because the second sub-inductor LS2 is connected to the third electrode ELT3, the second sub-inductor LS2 may be located adjacent to the third electrode ELT3. For example, the second sub-inductor LS2 may be located in the opposite direction of the first direction DR1 with respect to the third electrode ELT3 (e.g., the left of the third electrode ELT3).

However, the arrangement positions of the first and second sub-inductors LS1 and LS2 are not limited thereto. For example, the first and second sub-inductors LS1 and LS2 may be located in the second direction DR2, is the first direction DR1, the opposite direction of the second direction DR2, or the like with respect to the area center of the emission area EA.

In some embodiments, a winding direction of the first sub-inductor LS1 may be different from that of the second sub-inductor LS2. For example, the first sub-inductor LS1 may be wound clockwise from the center of the first sub-inductor LS1, and the second sub-inductor LS2 may be wound counterclockwise from the center of the second sub-inductor.

The first and second sub-inductors LS1 and LS2 correspond to a pattern capable of electromagnetic induction, and may have various planar shapes. The first and second sub-inductors LS1 and LS2 may entirely have a quadrangular shape including linear parts (e.g., parts linearly extending in the first direction DR1 or the second direction DR2), but the present disclosure is not limited thereto. For example, the first and second sub-inductors LS1 and LS2 may have a circular or elliptical shape including only curved parts, or may include a linear part and a curved part.

In some embodiments, a winding number of each of the first and second sub-inductors LS1 and LS2 may be one or more. An inductance of each of the first and second sub-inductors LS1 and LS2 may be a few pH (microhenries), and the first and second sub-inductors LS1 and LS2 may be implemented with only one-time winding. For example, the winding number of each of the first and second sub-inductors LS1 and LS2 may be about 1.5 times or about twice that which is shown in FIG. 9A.

In some embodiments, an outer end portion of the first sub-inductor LS1 may be connected to that of the second sub-inductor LS2. The first sub-inductor LS1 and the second sub-inductor LS2 may be integrally formed through the same process, and might not overlap with each other. An inner end portion (or central portion) of the first sub-inductor LS1 may be connected to the first electrode ELT1, and an inner end portion/central portion of the second sub-inductor LS2 may be connected to the third electrode ELT3. However, the present disclosure is not limited thereto. For example, the first and second sub-inductors LS1 and LS2 may be connected to each other through the inner end portions, and the first and third electrodes ELT1 and ELT3 may be respectively connected to the outer end portions of the first and second sub-inductors LS1 and LS2.

As shown in FIG. 9B, a first alignment electrode AELT1 and a second alignment electrode AELT2 may extend in the second direction DR2, and may be arranged along the first direction DR1. The first and second alignment electrodes AELT1 and AELT2 may even extend to an adjacent pixel.

A primary inductor LP may be located adjacent to one side of the first alignment electrode AELT1 to overlap with the first and second sub-inductors LS1 and LS2 (or a secondary inductor LS). The primary inductor LP may have a shape wound clockwise from the center of the primary inductor LP, but the present disclosure is not limited thereto. For example, the primary inductor LP may have a shape wound counterclockwise from the center of the primary inductor LP. Also, the primary inductor LP is a pattern capable of electromagnetic induction, and may have various planar shapes. For example, the primary inductor LP may have various shapes including a quadrangular shape, a circular shape, and the like, or may include a linear part and a curved part.

One end portion (e.g., an inner end portion/central portion) of the primary inductor LP may be connected to a first transistor through a contact hole penetrating the protective layer PSV (see FIG. 8A), and the other end portion (e.g., an outer end portion) of the primary inductor LP may be connected to a power line (e.g., a line to which the third power source VDD2 is applied) or a bridge pattern through a contact hole penetrating the protective layer PSV (see FIG. 8A).

Figure 10A:
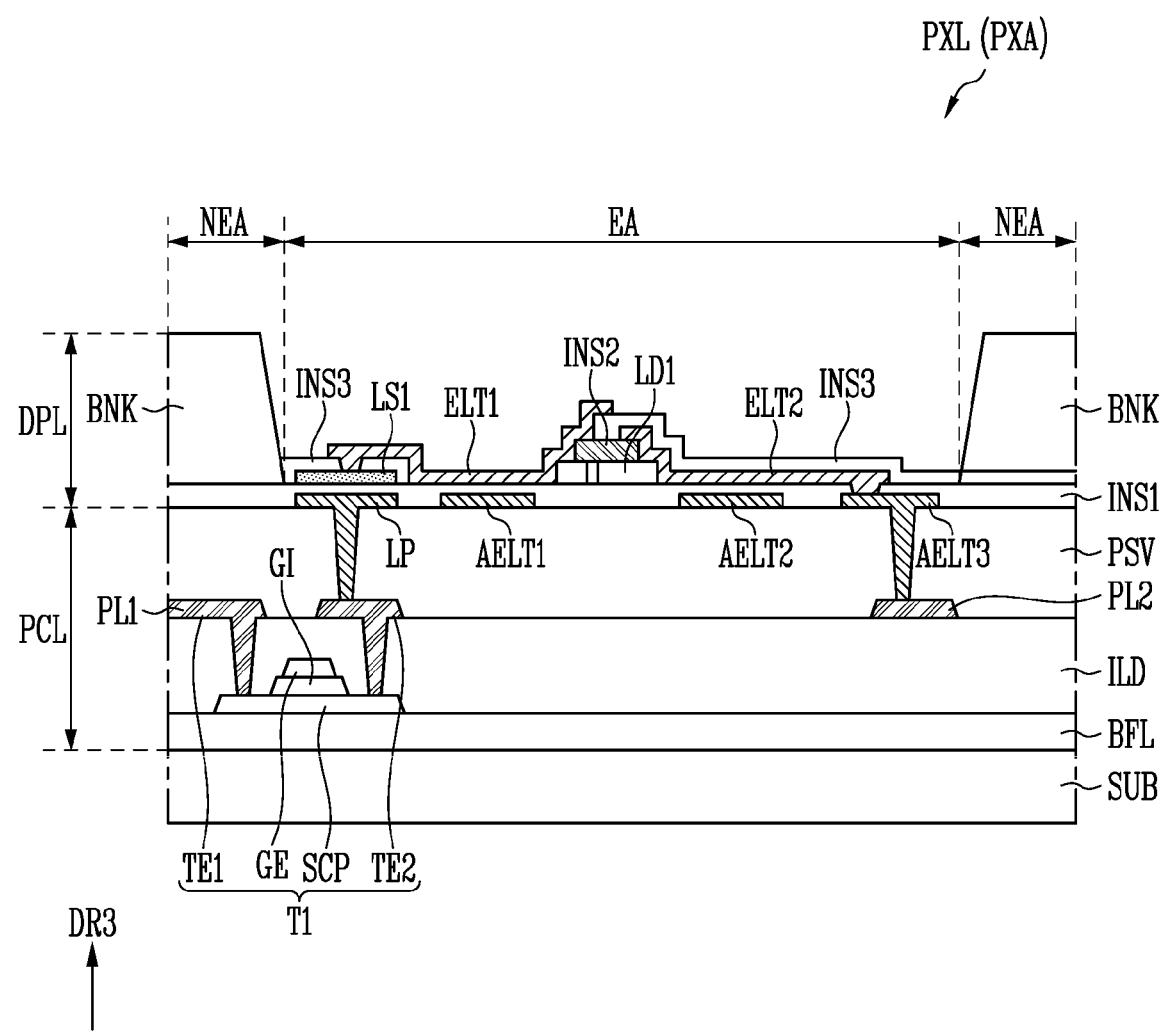
FIGS. 10A and 10B are sectional views illustrating other embodiments of the pixel shown in FIG. 3.
Figure 10B:
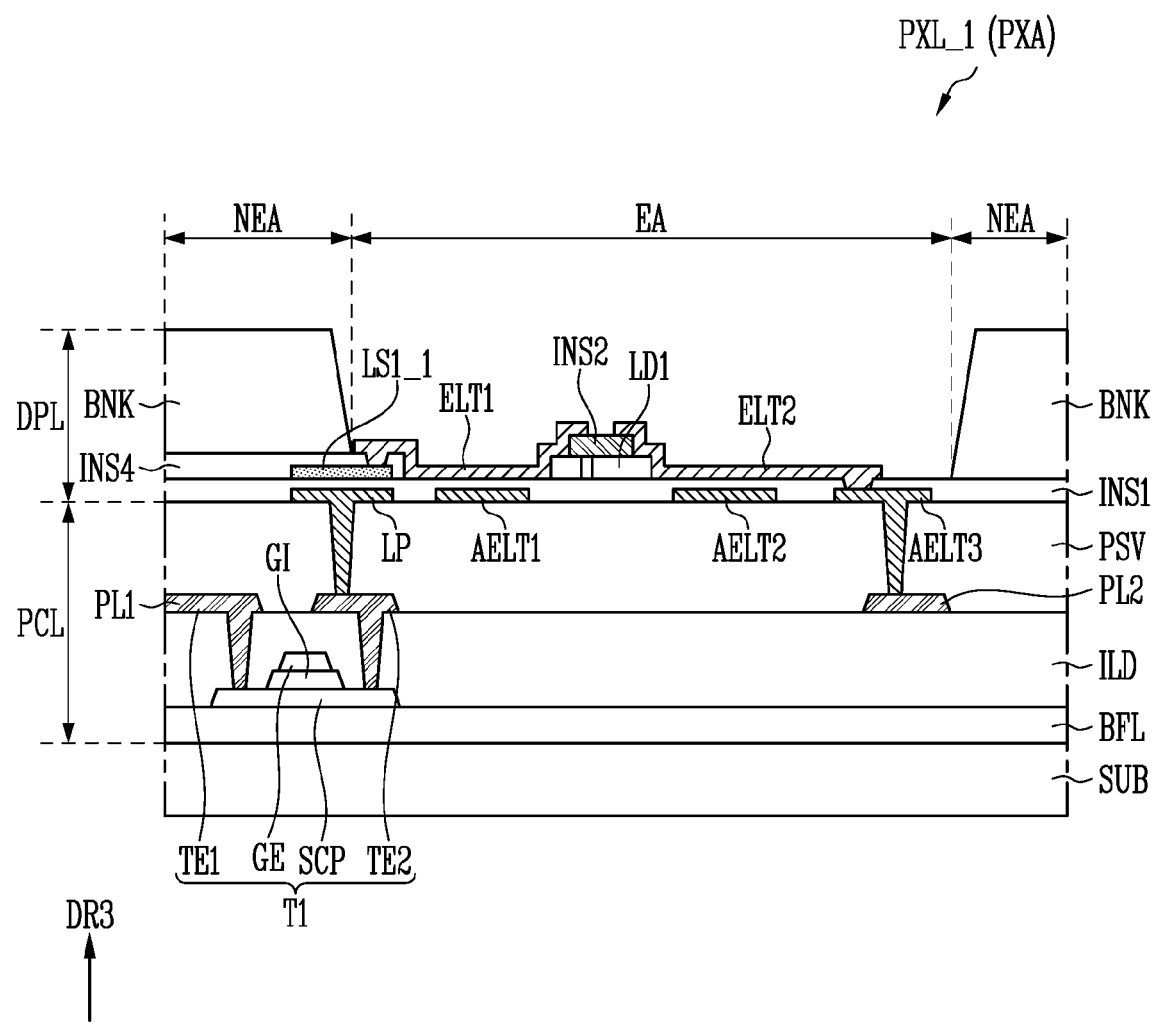

FIGS. 10A and 10B are sectional views illustrating other embodiments of the pixel shown in FIG. 3. A drawing corresponding to FIG. 8A is illustrated in FIGS. 10A and 10B.

First, referring to FIGS. 1 to 3, 8A to 8C, and 10A, a first electrode ELT1 may be located in layer that is different from that of a second electrode ELT2.

In some embodiments, a pixel PXL may further include a third insulating layer INS3. The second electrode ELT2 and a first sub-inductor LS1 may be formed on the first insulating layer INS1 through the same process, and the third insulating layer INS3 may cover the second electrode ELT2 and the first sub-inductor LS1. Also, the third insulating layer INS3 may expose a first end portion of a first light emitting element LD1. The third insulating layer INS3 may be an inorganic insulating layer including an inorganic material or an organic insulating layer including an organic material.

The first electrode ELT1 may be located on the third insulating layer INS3. The first electrode ELT1 may be spaced apart from the second electrode ELT2 with the third insulating layer INS3 interposed therebetween. The first electrode ELT1 may be in contact with the exposed first end portion of the first light emitting element LD1. The first electrode ELT1 may be in contact with the first sub-inductor LS1 through a contact hole penetrating the third insulating layer INS3.

Meanwhile, although a case where the first electrode ELT1 is located in a layer that is different from that of the first sub-inductor LS1 has been illustrated in FIG. 10A, the present disclosure is not limited thereto. For example, the first electrode ELT1 may be formed with the first sub-inductor LS1 through the same process, the third insulating layer INS3 may cover the first electrode ELT1 and the first sub-inductor LS1, and the second electrode ELT2 may be located on the third insulating layer INS3. The first electrode ELT1 may be connected to an outer end portion of the first sub-inductor LS1, and the first sub-inductor LS1 and the second sub-inductor LS2 (see FIG. 9A) may be connected to each other through a separate bridge pattern (e.g., a pattern formed on the third insulating layer INS3 through the same process as the second electrode ELT2).

Referring to FIGS. 1 to 3, 8A to 8C, and 10B, a first sub-inductor LS1_1 may be located in a layer different from that of first and second electrodes ELT1 and ELT2. Also, the first sub-inductor LS1_1 (and a primary inductor LP) may overlap with a bank BNK. That is, the first sub-inductor LS1_1 may be located (e.g., at least partially) in a non-emission area NEA.

In some embodiments, a pixel PXL_1 may further include a fourth insulating layer INS4. The first sub-inductor LS1_1 may be formed on a first insulating layer INS1, and the fourth insulating layer INS4 may cover the first sub-inductor LS1_1. The bank BNK may be located on the fourth insulating layer INS4 to overlap with the first sub-inductor LS1_1. Meanwhile, after a first light emitting element LD1 is aligned, first and second electrodes ELT1 and ELT2 may be formed, and the first electrode ELT1 may be in contact with the first sub-inductor LS1_1 through a contact hole penetrating the fourth insulating layer INS4.

When the first sub-inductor LS1_1 overlaps with the bank BNK, influence (e.g., interference) of the first sub-inductor LS1_1 on components located in an emission area EA can be reduced.

As described above, the first sub-inductor LS1 or LS1_1 may be located in a layer that is different from that of at least one of the first electrode ELT1 and the second electrode ELT2. In addition, the first sub-inductor LS1_1 (and the primary inductor LP) may overlap with the bank BNK or may be located in the non-emission area NEA.

Meanwhile, although only a relationship between the first sub-inductor LS1 or LS1_1 and the first and second electrodes ELT1 and ELT2 has been illustrated in FIGS. 10A and 10B, the relationship may be applied to the second sub-inductor LS2 (see FIG. 3) and the third and fourth electrodes ELT3 and ELT4. In addition, the embodiments shown in FIGS. 10A and 10B may also be applied to the embodiments shown in FIGS. 8B and 8C.

Figure 11:
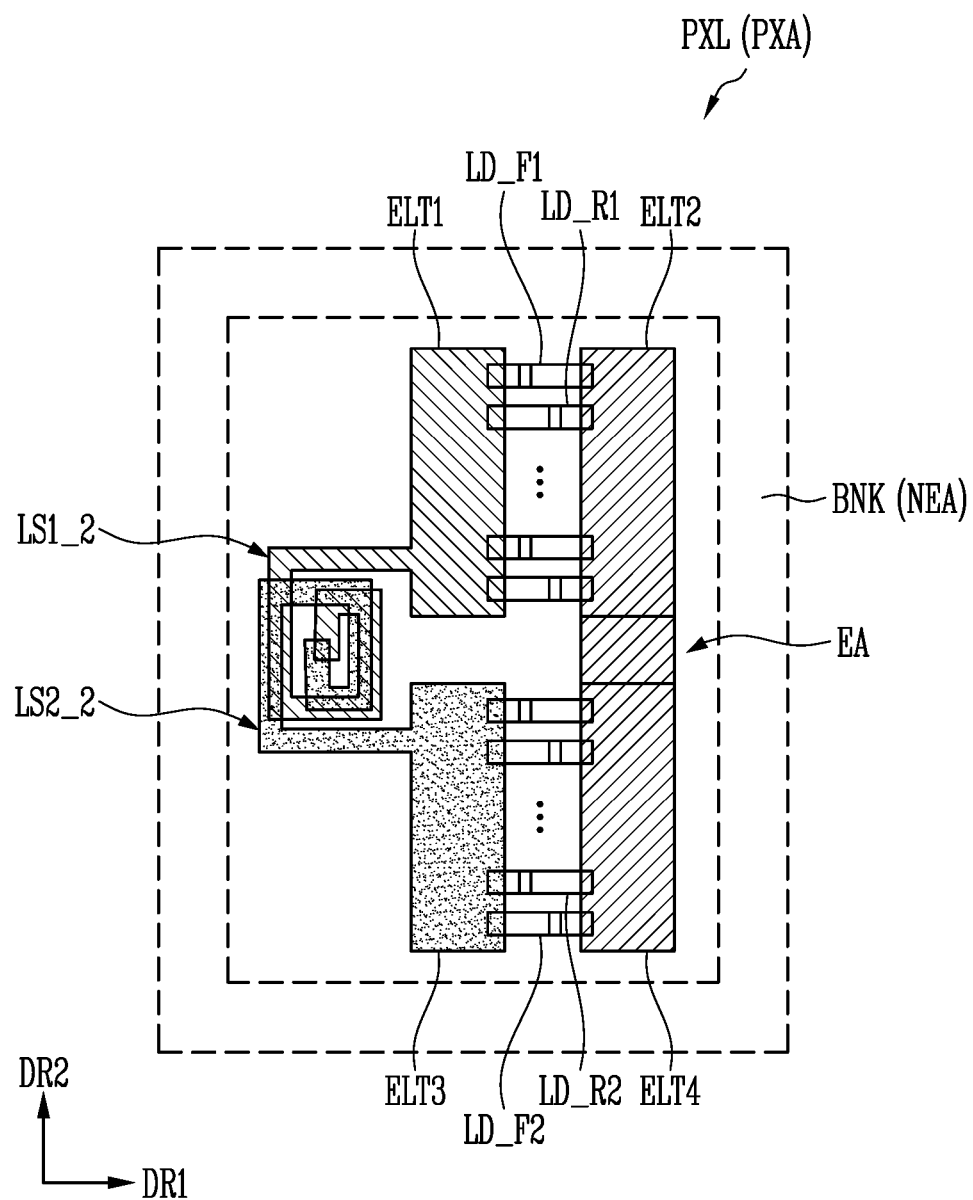
FIG. 11 is a plan view illustrating other embodiments of the pixel shown in FIG. 3.

FIG. 11 is a plan view illustrating other embodiments of the pixel shown in FIG. 3. A drawing corresponding to FIG. 9A is illustrated in FIG. 11.

Referring to FIGS. 1 to 3, 8A to 8C, 9A, and 11, a first sub-inductor LS1_2 and a second sub-inductor LS2_2 may overlap with each other. The first sub-inductor LS1_2 may overlap with the second sub-inductor LS2_2 with at least one insulating layer (e.g., the third insulating layer INS3 (see FIG. 10A) or the fourth insulating layer INS4 (see FIG. 10B)) interposed therebetween.

For example, the second sub-inductor LS2_2 may be located on the first sub-inductor LS1_2. In another example, the first sub-inductor LS1_2 may be located on the second sub-inductor LS2_2.

In some embodiments, an inner end portion of the first sub-inductor LS1_2 may be connected to that of the second sub-inductor LS2_2, an outer end portion of the first sub-inductor LS1_2 may be connected to a first electrode ELT1, and an outer end portion of the second sub-inductor LS2_2 may be connected to a third electrode ELT3. The first and second electrodes ELT1 and ELT2 may be formed in the same layer as one of the first and second sub-inductors LS1_2 and LS2_2, but the present disclosure is not limited thereto. For example, the first electrode ELT1 may be formed in the same layer as the first sub-inductor LS1_2, and the third electrode ELT3 may be formed in the same layer as the second sub-inductor LS2_2. In other embodiments, the first and third electrodes ELT1 and ELT3 may be formed in the same layer as one of the first and second sub-inductors LS1_2 and LS2_2.

Although a case where the inner end portion of the first sub-inductor LS1_2 is connected to that of the second sub-inductor LS2_2 has been illustrated in FIG. 11, the first sub-inductor LS1_2 and the second sub-inductor LS2_2 are not limited thereto. For example, the outer end portion of the first sub-inductor LS1_2 may be connected to that of the second sub-inductor LS2_2.

In addition, the positions of the first and second sub-inductors LS1_2 and LS2_2 with respect to the primary inductor LP (see FIG. 9B) may be variously changed. For example, the first and second sub-inductors LS1_2 and LS2_2 may be located on the primary inductor LP. In some embodiments, one of the first and second sub-inductors LS1_2 and LS2_2 may be located under the primary inductor LP, and the other of the first and second sub-inductors LS1_2 and LS2_2 may be located above the primary inductor LP. That is, the first and second sub-inductors LS1_2 and LS2_2 may be located at various positions within a range in which the primary inductor LP and the first and second sub-inductors LS1_2 and LS2_2 overlap with each other (e.g., a range in which the first and second sub-inductors LS1_2 and LS2_2 can be inductively coupled to each other).

In the display device in accordance with the present disclosure, a current flowing through light emitting elements can be controlled by using inductors inductively coupled to each other. Thus, luminance deterioration caused by contact resistance between conductive layers located between a transistor and a light emitting element (e.g., a contact defect between conductive layers provided instead of the inductors) can be reduced or prevented.

Also, in the display device in accordance with the present disclosure, currents can alternately flow in different current directions through light emitting elements by using inductors inductively coupled to each other. Thus, all the light emitting elements arranged in the different current directions can emit light or contribute to light emission, and luminance (or light emission efficiency) with respect to the same stress (or the same current) can be improved.

Embodiments of the present disclosure have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with any particular embodiments may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, with functional equivalents thereof to be included therein.

What is claimed is:

1. A display device comprising a pixel comprising:
   a primary inductor and a secondary inductor that are inductively coupled to each other, the secondary inductor comprising a first sub-inductor, and a second sub-inductor connected to the first sub-inductor;
   a pixel circuit electrically connected to the primary inductor, and configured to control a current flowing through the primary inductor by using at least one transistor; and
   a light emitting unit electrically connected to the secondary inductor, and comprising:
      a first electrode electrically connected to the first sub-inductor;
      a second electrode;
      a third electrode electrically connected to the second sub-inductor;
      a fourth electrode connected to the second electrode;
      first light emitting elements connected in parallel between the first electrode and the second electrode; and
      second light emitting elements connected in parallel to each other between the third electrode and the fourth electrode.

2. The display device of claim 1, wherein the primary inductor is electrically connected between a first node and a second node, and
   wherein the pixel circuit comprises:
      a first transistor electrically connected between a first power line and the first node; and
      a second transistor electrically connected between the first node and a second power line.

3. The display device of claim 2, wherein the first transistor is turned on to provide a first current in a first current direction to the primary inductor in a first period, and
   wherein the second transistor is turned on to provide a second current in a second current direction to the primary inductor in a second period.

4. The display device of claim 3, wherein a magnitude of current induced in the light emitting unit decreases as a width of the first and second periods decreases.

5. The display device of claim 2,
   wherein a first terminal of the first sub-inductor is electrically connected to the first electrode, and
   wherein a second terminal of the first sub-inductor is electrically connected to the second electrode.

6. The display device of claim 5, wherein the first light emitting elements comprise a first forward light emitting element and a first reverse light emitting element,
   wherein the first forward light emitting element is connected in a first current direction between the first electrode and the second electrode, and
   wherein the first reverse light emitting element is connected in a second current direction that is different from the first current direction between the first electrode and the second electrode.

7. The display device of claim 5, wherein the second electrode is electrically connected to the second power line.

8. The display device of claim 5,
   wherein a first terminal of the second sub-inductor is connected to the second terminal of the first sub-inductor, and
   wherein a second terminal of the second sub-inductor is electrically connected to the third electrode.

9. The display device of claim 8, wherein a winding direction of the first sub-inductor is different from that of the second sub-inductor.

10. The display device of claim 8, wherein the pixel further comprises:
    a protective layer over the first power line, the second power line, and the first transistor; and
    a first insulating layer on the protective layer,
    wherein the primary inductor is between the protective layer and the first insulating layer,
    wherein the first electrode, the second electrode, and the first sub-inductor are on the first insulating layer, and
    wherein, in a plan view, the first sub-inductor overlaps with the primary inductor.

11. The display device of claim 10, wherein, in a plan view, the second sub-inductor overlaps with the primary inductor, but does not overlap with the first sub-inductor.

12. The display device of claim 10, wherein the pixel further comprises a bank on the first insulating layer, the bank defining an emission area, and
    wherein, in a plan view, the first sub-inductor and the first light emitting elements are in the emission area.

13. The display device of claim 10, wherein the pixel further comprises:
    a first pattern and a second pattern between the protective layer and the first insulating layer;
    a first alignment electrode between the first pattern and the first insulating layer; and
    a second alignment electrode between the second pattern and the first insulating layer,
    wherein the first electrode overlaps with the first alignment electrode,
    wherein the second electrode overlaps with the second alignment electrode, and wherein, in a plan view, the first light emitting elements are between the first electrode and the second electrode.

14. The display device of claim 13, wherein the first electrode is not in contact with the first alignment electrode.

15. The display device of claim 14, wherein the first electrode comprises a transparent conductive material, and
wherein the first alignment electrode comprises a light reflective material.

16. The display device of claim 13, wherein the pixel further comprises a light conversion pattern layer over the first and second light emitting elements, and
wherein the light conversion pattern layer comprises:
a color conversion layer for converting light of a first color, which is emitted from the first and second light emitting, into light of a second color; and
a color filter on the color conversion layer for allowing the light of the second color to be selectively transmitted therethrough.

17. The display device of claim 10, wherein the pixel further comprises a bank on the first insulating layer and defining an emission area,
wherein, in a plan view, the first light emitting elements are in the emission area, and
wherein, in a plan view, the first sub-inductor overlaps with the bank.

18. The display device of claim 10, wherein, in a plan view, the second sub-inductor overlaps with the first sub-inductor.

19. The display device of claim 1, wherein the primary inductor is electrically connected between a first node and a second node, and
wherein the pixel circuit comprises:
a first transistor electrically connected between a first power line and the first node;
a second transistor electrically connected between a second power line and the first node;
a third transistor electrically connected between the first power line and the second node; and
a fourth transistor electrically connected between the second power line and the second node.

20. The display device of claim 19, wherein the first transistor and the fourth transistor are configured to be turned on to provide a first current in a first current direction to the primary inductor in a first period, and
wherein the second transistor and the third transistor are configured to be turned on to provide a second current in a second current direction to the primary inductor in a second period.

* * * * *

UNITED STATES PATENT AND TRADEMARK OFFICE
CERTIFICATE OF CORRECTION

PATENT NO. : 12,284,887 B2  
APPLICATION NO. : 17/579479  
DATED : April 22, 2025  
INVENTOR(S) : Gwang Teak Lee Page 1 of 1

It is certified that error appears in the above-identified patent and that said Letters Patent is hereby corrected as shown below:

In the Claims

In Column 31, Lines 15, in Claim 16, delete "emitting," and insert -- emitting elements, --.

Signed and Sealed this  
Twenty-ninth Day of July, 2025

Coke Morgan Stewart  
*Acting Director of the United States Patent and Trademark Office*